United States Patent
Lee et al.

(10) Patent No.: US 12,499,795 B2
(45) Date of Patent: Dec. 16, 2025

(54) DISPLAY APPARATUS AND ELECTRONIC APPARATUS INCLUDING THE SAME

(71) Applicant: Samsung Display Co., Ltd., Yongin-Si (KR)

(72) Inventors: Seung-Jun Lee, Yongin-si (KR); Tae-Ho Kim, Yongin-si (KR); Yongsu Lee, Yongin-si (KR); Jaewoo Lee, Yongin-si (KR); Seung-Hwan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/605,817

(22) Filed: Mar. 15, 2024

(65) Prior Publication Data

US 2024/0321160 A1    Sep. 26, 2024

(30) Foreign Application Priority Data

Mar. 22, 2023  (KR) ........................ 10-2023-0037351

(51) Int. Cl.
| | |
|---|---|
| *G09G 3/00* | (2006.01) |
| *H10D 86/40* | (2025.01) |
| *H10D 86/60* | (2025.01) |

(52) U.S. Cl.
CPC ........... *G09G 3/035* (2020.08); *H10D 86/441* (2025.01); *H10D 86/60* (2025.01);
(Continued)

(58) Field of Classification Search
CPC ...... H10D 86/441; H10D 86/60; G09G 3/035; G09G 2310/027; G09G 2310/0291; G09G 2310/0297
(Continued)

(56) References Cited

U.S. PATENT DOCUMENTS

| | | |
|---|---|---|
| 11,302,768 B2 | 4/2022 | Kang et al. |
| 11,386,851 B2 | 7/2022 | Park et al. |

(Continued)

FOREIGN PATENT DOCUMENTS

| | | | | |
|---|---|---|---|---|
| CA | 2126446 C | * | 7/2003 | ......... H10D 86/0214 |
| CN | 110716658 A | * | 1/2020 | ........... H03K 17/962 |

(Continued)

*Primary Examiner* — Kwin Xie
(74) *Attorney, Agent, or Firm* — Innovation Counsel LLP

(57) ABSTRACT

A display apparatus is disclosed that includes a data driver, a demux circuit, a first wiring mixing structure, a second wiring mixing structure, a display panel and a bending area. The data driver includes first to fourth output amplifiers. The demux circuit is configured to branch the first to fourth output amplifiers to first to eighth output lines through demux switching. The first wiring mixing structure is connected to the demux circuit. The second wiring mixing structure is connected to the first wiring mixing structure. The display panel includes data lines connected to the second wiring mixing structure. The bending area is disposed between the display panel and the data driver. The demux circuit is disposed between an integrated circuit area of the data driver and the bending area. The bending area includes a bending line for folding elements toward a rear surface of the display panel. The display panel is disposed on a first side of the bending line and the demux circuit and the integrated circuit area are disposed on a second side of the bending line.

20 Claims, 20 Drawing Sheets

(52) U.S. Cl.
CPC .............. *G09G 2310/027* (2013.01); *G09G 2310/0291* (2013.01); *G09G 2310/0297* (2013.01)

(58) Field of Classification Search
USPC ........................................................ 345/214
See application file for complete search history.

(56) References Cited

U.S. PATENT DOCUMENTS

| | | | |
|---|---|---|---|
| 11,430,393 B2 | 8/2022 | Lim | |
| 2018/0217466 A1* | 8/2018 | Nomura | G02F 1/136286 |
| 2020/0160807 A1* | 5/2020 | Tomie | G09G 3/3677 |
| 2020/0184917 A1* | 6/2020 | Morita | G09G 3/3614 |
| 2020/0320930 A1* | 10/2020 | Toyotaka | H10K 59/40 |
| 2022/0199750 A1 | 6/2022 | Cho et al. | |
| 2022/0208093 A1 | 6/2022 | Keum et al. | |

FOREIGN PATENT DOCUMENTS

| | | | | |
|---|---|---|---|---|
| DE | 102019002202 A1 * | 10/2019 | ........... | G09G 3/3225 |
| KR | 10-2020-0143558 A | 12/2020 | | |
| KR | 10-2020-0145953 A | 12/2020 | | |
| KR | 10-2022-0017046 A | 2/2022 | | |
| KR | 10-2022-0091637 A | 7/2022 | | |
| KR | 10-2022-0094300 A | 7/2022 | | |
| TW | 201743311 A * | 12/2017 | ............... | G09G 3/30 |

\* cited by examiner

FIG. 4

| FHD Demux+BRS IC Amp 1080 (Ref.=4Bundle=8Bundle) | | | | | |
|---|---|---|---|---|---|
| | Scan #1 | | Scan #2 | | Data Mapping | |
| Amp No. | Demux A | Demux B | Demux A | Demux B | Demux A | Demux B |
| Y1 | R | G | B | G | 541 | 542 |
| Y2 | B | G | R | G | 539 | 540 |
| Y3 | B | G | R | G | 543 | 544 |
| Y4 | R | G | B | G | 537 | 538 |
| Y5 | R | G | B | G | 545 | 546 |
| Y6 | B | G | R | G | 535 | 536 |
| Y7 | B | G | R | G | 547 | 548 |
| Y8 | R | G | B | G | 533 | 534 |
| Y9 | R | G | B | G | 549 | 550 |
| Y10 | B | G | R | G | 531 | 532 |
| Y11 | B | G | R | G | 551 | 552 |
| Y12 | R | G | B | G | 529 | 530 |
| Y13 | R | G | B | G | 553 | 554 |
| Y14 | B | G | R | G | 527 | 528 |
| Y15 | B | G | R | G | 555 | 556 |
| Y16 | R | G | B | G | 525 | 526 |

FIG. 5

| IC Pad 1080 (=Amp) | | | | |
|---|---|---|---|---|
| Amp No. | Order1 | Scan #1 | Scan #2 | Data |
| Y1 | 1 | R | B | 541 |
| | 2 | G | G | 542 |
| Y2 | 3 | B | R | 539 |
| | 4 | G | G | 540 |
| Y3 | 5 | B | R | 543 |
| | 6 | G | G | 544 |
| Y4 | 7 | R | B | 537 |
| | 8 | G | G | 538 |
| Y5 | 9 | R | B | 545 |
| | 10 | G | G | 546 |
| Y6 | 11 | B | R | 535 |
| | 12 | G | G | 536 |
| Y7 | 13 | B | R | 547 |
| | 14 | G | G | 548 |
| Y8 | 15 | R | B | 533 |
| | 16 | G | G | 534 |

FIG. 6

| Demux Pad 2160 | | | | | |
|---|---|---|---|---|---|
| Order1 | Switch | Order2 | Scan #1 | Scan #2 | Data |
| 1 | A | 1 | R | B | 541 |
| 2 | B | 2 | G | G | 542 |
| 3 | B | 4 | G | G | 540 |
| 4 | A | 3 | B | R | 539 |
| 5 | A | 5 | B | R | 543 |
| 6 | B | 6 | G | G | 544 |
| 7 | B | 8 | G | G | 538 |
| 8 | A | 7 | R | B | 537 |
| 9 | A | 9 | R | B | 545 |
| 10 | B | 10 | G | G | 546 |
| 11 | B | 12 | G | G | 536 |
| 12 | A | 11 | B | R | 535 |
| 13 | A | 13 | B | R | 547 |
| 14 | B | 14 | G | G | 548 |
| 15 | B | 16 | G | G | 534 |
| 16 | A | 15 | R | B | 533 |

FIG. 7

| 4Bundle Pad 2160 | | | | | |
|---|---|---|---|---|---|
| Order2 | CLA/B | Order3 | Scan #1 | Scan #2 | Data |
| 1 | A | 1 | R | B | 541 |
| 2 | A | 3 | B | R | 539 |
| 4 | B | 2 | G | G | 542 |
| 3 | B | 4 | G | G | 540 |
| 5 | B | 6 | G | G | 544 |
| 6 | B | 8 | G | G | 538 |
| 8 | A | 5 | B | R | 543 |
| 7 | A | 7 | R | B | 537 |
| 9 | A | 9 | R | B | 545 |
| 10 | A | 11 | B | R | 535 |
| 12 | B | 10 | G | G | 546 |
| 11 | B | 12 | G | G | 536 |
| 13 | B | 14 | G | G | 548 |
| 14 | B | 16 | G | G | 534 |
| 16 | A | 13 | B | R | 547 |
| 15 | A | 15 | R | B | 533 |

FIG. 8

| Active Area | | | |
|---|---|---|---|
| Data | CLA/B | Scan #1 | Scan #2 |
| 1 | A | R | B |
| 2 | B | G | G |
| 3 | A | B | R |
| 4 | B | G | G |
| 5 | A | R | B |
| 6 | B | G | G |
| 7 | A | B | R |
| 8 | B | G | G |
| 9 | A | R | B |
| 10 | B | G | G |
| 11 | A | B | R |
| 12 | B | G | G |
| 13 | A | R | B |
| 14 | B | G | G |
| 15 | A | B | R |
| 16 | B | G | G |

FIG. 11

| IC Pad | 1A | 1B | 2A | 2B | Data |
|---|---|---|---|---|---|
| Y1 | R | G | B | G | 541/542 |
| Y2 | B | G | R | G | 539/540 |
| Y3 | B | G | R | G | 543/544 |
| Y4 | R | G | B | G | 537/538 |
| Y5 | R | G | B | G | 545/546 |
| Y6 | B | G | R | G | 535/536 |
| Y7 | B | G | R | G | 547/548 |
| Y8 | R | G | B | G | 533/534 |

FIG. 12

| No. | CLK | #1 | #2 |
|---|---|---|---|
| 541 | A | R | B |
| 539 | A | B | R |
| 542 | B | G | G |
| 540 | B | G | G |
| 544 | B | G | G |
| 538 | B | G | G |
| 543 | A | B | R |
| 537 | A | R | B |

⋮

| 1077 | A | R | B |
| 3 | A | B | R |
| 1078 | B | G | G |
| 4 | B | G | G |
| 1080 | B | G | G |
| 2 | B | G | G |
| 1079 | A | B | R |
| 1 | A | R | B |

FIG. 13

| FHD Demux+BRS IC Amp 1080 (Ref.=4Bundle=8Bundle) | | | | | | |
|---|---|---|---|---|---|---|
| | Scan #1 | | Scan #2 | | Data Mapping | |
| Amp No. | Demux A | Demux B | Demux A | Demux B | Demux A | Demux B |
| Y1 | R | G | B | G | 541 | 542 |
| Y2 | B | G | R | G | 539 | 540 |
| Y3 | B | G | R | G | 543 | 544 |
| Y4 | R | G | B | G | 537 | 538 |
| Y5 | R | G | B | G | 545 | 546 |
| Y6 | B | G | R | G | 535 | 536 |
| Y7 | B | G | R | G | 547 | 548 |
| Y8 | R | G | B | G | 533 | 534 |
| Y9 | R | G | B | G | 549 | 550 |
| Y10 | B | G | R | G | 531 | 532 |
| Y11 | B | G | R | G | 551 | 552 |
| Y12 | R | G | B | G | 529 | 530 |
| Y13 | R | G | B | G | 553 | 554 |
| Y14 | B | G | R | G | 527 | 528 |
| Y15 | B | G | R | G | 555 | 556 |
| Y16 | R | G | B | G | 525 | 526 |

FIG. 14

| Amp No. | Order1 | Scan #1 | Scan #2 | Data |
|---|---|---|---|---|
| colspan=5: IC Pad 1080 (=Amp) | | | | |
| Y1 | 1 | R | B | 541 |
| Y1 | 2 | G | G | 542 |
| Y2 | 3 | B | R | 539 |
| Y2 | 4 | G | G | 540 |
| Y3 | 5 | B | R | 543 |
| Y3 | 6 | G | G | 544 |
| Y4 | 7 | R | B | 537 |
| Y4 | 8 | G | G | 538 |
| Y5 | 9 | R | B | 545 |
| Y5 | 10 | G | G | 546 |
| Y6 | 11 | B | R | 535 |
| Y6 | 12 | G | G | 536 |
| Y7 | 13 | B | R | 547 |
| Y7 | 14 | G | G | 548 |
| Y8 | 15 | R | B | 533 |
| Y8 | 16 | G | G | 534 |

FIG. 15

| Demux Pad 2160 | | | | | |
|---|---|---|---|---|---|
| Order1 | Switch | Order2 | Scan #1 | Scan #2 | Data |
| 1 | A | 1 | R | B | 541 |
| 2 | B | 2 | G | G | 542 |
| 3 | B | 4 | G | G | 540 |
| 4 | A | 3 | B | R | 539 |
| 5 | A | 5 | B | R | 543 |
| 6 | B | 6 | G | G | 544 |
| 7 | B | 8 | G | G | 538 |
| 8 | A | 7 | R | B | 537 |
| 9 | A | 9 | R | B | 545 |
| 10 | B | 10 | G | G | 546 |
| 11 | B | 12 | G | G | 536 |
| 12 | A | 11 | B | R | 535 |
| 13 | A | 13 | B | R | 547 |
| 14 | B | 14 | G | G | 548 |
| 15 | B | 16 | G | G | 534 |
| 16 | A | 15 | R | B | 533 |

FIG. 16

| 8Bundle Pad 2160 | | | | | |
|---|---|---|---|---|---|
| Order2 | CLA/B | Order3 | Scan #1 | Scan #2 | Data |
| 1 | A | 1 | R | B | 541 |
| 2 | A | 3 | B | R | 539 |
| 4 | A | 5 | B | R | 543 |
| 3 | A | 7 | R | B | 537 |
| 5 | B | 2 | G | G | 542 |
| 6 | B | 4 | G | G | 540 |
| 8 | B | 6 | G | G | 544 |
| 7 | B | 8 | G | G | 538 |
| 9 | B | 10 | G | G | 546 |
| 10 | B | 12 | G | G | 536 |
| 12 | B | 14 | G | G | 548 |
| 11 | B | 16 | G | G | 534 |
| 13 | A | 9 | R | B | 545 |
| 14 | A | 11 | B | R | 535 |
| 16 | A | 13 | B | R | 547 |
| 15 | A | 15 | R | B | 533 |

FIG. 17

| Active Area | | | |
|---|---|---|---|
| Data | CLA/B | Scan #1 | Scan #2 |
| 1 | A | R | B |
| 2 | B | G | G |
| 3 | A | B | R |
| 4 | B | G | G |
| 5 | A | R | B |
| 6 | B | G | G |
| 7 | A | B | R |
| 8 | B | G | G |
| 9 | A | R | B |
| 10 | B | G | G |
| 11 | A | B | R |
| 12 | B | G | G |
| 13 | A | R | B |
| 14 | B | G | G |
| 15 | A | B | R |
| 16 | B | G | G |

DISPLAY APPARATUS AND ELECTRONIC APPARATUS INCLUDING THE SAME

PRIORITY STATEMENT

This application claims priority under 35 U.S.C. § 119 to Korean Patent Application No. 10-2023-0037351, filed on Mar. 22, 2023 in the Korean Intellectual Property Office KIPO, the contents of which are herein incorporated by reference in their entireties.

BACKGROUND

1. Field

Embodiments of the present inventive concept relate to a display apparatus and an electronic apparatus including the display apparatus. More particularly, embodiments of the present inventive concept relate to a display apparatus including a wire mixing structure.

2. Description of the Related Art

Generally, a display apparatus includes a display panel and a display panel driver. The display panel displays an image based on input image data. The display panel includes a plurality of gate lines, a plurality of data lines and a plurality of pixels. The display panel driver includes a gate driver, a data driver and a driving controller. The gate driver outputs gate signals to the gate lines. The data driver outputs data voltages to the data lines. The driving controller controls the gate driver and the data driver.

The display panel driver may include a demux circuit for dividing R-G-B-G data of the data driver into R-B data and G-G data. In the display apparatus including the demux circuit, a display quality may be reduced due to coupling between a data line outputting the R-B data and a data line outputting the G-G data.

In addition, the data driver may be formed in a border reduction structure in which a data voltage applied to a data line at a center of the display panel and a data voltage applied to a data line at an edge of the display panel are alternatively outputted to reduce a dead space of the display apparatus. In this border reduction structure, horizontal lines may be added to transfer data voltages to data lines at the edge, and display quality may be reduced due to coupling between the horizontal lines and the data lines.

In addition, the demux circuit may be disposed adjacent to an integrated circuit of the data driver to reduce the dead space of the display apparatus. In this case, the number of wires floating on the display panel further increases so that the display quality may further reduced due to additional coupling.

In addition, when the output of the conventional data driver is connected to the data line of the display panel as it is, a data mapping error may occur in which the R-B data are applied to G-G pixels or the G-G data are applied to R-B pixels due to the position shift of the demux circuit.

SUMMARY

Embodiments of the present inventive concept may provide a display apparatus including a wire mixing structure to enhance demux coupling and prevent a data mapping error.

Embodiments of the present inventive concept also may provide an electronic apparatus including the display apparatus.

In an embodiment of a display apparatus according to the present inventive concept, the display apparatus includes a data driver, a demux circuit, a first wiring mixing structure, a second wiring mixing structure, a display panel and a bending area. The data driver includes first to fourth output amplifiers. The demux circuit is configured to branch the first to fourth output amplifiers to first to eighth output lines through demux switching. The first wiring mixing structure is connected to the demux circuit. The second wiring mixing structure is connected to the first wiring mixing structure. The display panel includes data lines connected to the second wiring mixing structure. The bending area is disposed between the display panel and the data driver. The demux circuit is disposed between an integrated circuit area of the data driver and the bending area. The bending area includes a bending line for folding elements toward a rear surface of the display panel. The display panel is disposed on a first side of the bending line and the demux circuit and the integrated circuit area are disposed on a second side of the bending line.

In an embodiment, when a first order of first output data generated by alternately demuxing the first to fourth output amplifiers is 1, 2, 3, 4, 5, 6, 7 and 8, a final order of final output data outputted by the second wiring mixing structure may be 1, 4, 2, 3, 5, 8, 6 and 7.

In an embodiment, some of output data of the data driver may be normal data directly applied to data lines of the display panel. Some of the output data of the data driver may be border reduction data applied to data lines of the display panel through border reduction horizontal lines.

In an embodiment, when the first order of the first output data generated by alternately demuxing the first to fourth output amplifiers is 1, 2, 3, 4, 5, 6, 7 and 8, the first output data having a number one order, a number two order, a number five order and a number six order may be the normal data and the first output data having a number three order, a number four order, a number seven order and a number eight order may be the border reduction data.

In an embodiment, the first, the fourth, the fifth and the eighth output lines of the demux circuit may be activated by a first switching signal. The second, the third, the sixth and the seventh output lines of the demux circuit may be activated by a second switching signal.

In an embodiment, when the first order of the first output data generated by alternately demuxing the first to fourth output amplifiers is 1, 2, 3, 4, 5, 6, 7 and 8, a second order of second output data of the demux circuit may be 1, 2, 4, 3, 5, 6, 8 and 7.

In an embodiment, when the second order which is an order of prior data of the first wiring mixing structure is 1, 2, 4, 3, 5, 6, 8 and 7, a third order which is an order of after data of the first wiring mixing structure may be 1, 3, 2, 4, 6, 8, 5 and 7.

In an embodiment, when the third order which is an order of prior data of the second wiring mixing structure is 1, 3, 2, 4, 6, 8, 5 and 7, the final order which is an order of after data of the second wiring mixing structure may be 1, 4, 2, 3, 5, 8, 6 and 7.

In an embodiment, input terminals of the first wiring mixing structure may include first to eighth A pads. Output terminals of the first wiring mixing structure may include first to eighth B pads. The first A pad may be connected to the first B pad. The second A pad may be connected to the third B pad. The third A pad may be connected to the fourth B pad. The fourth A pad may be connected to the second B pad. The fifth A pad may be connected to the seventh B pad. The sixth A pad may be connected to the fifth B pad. The seventh A pad may be connected to the sixth B pad. The eighth A pad may be connected to the eighth B pad.

In an embodiment, input terminals of the second wiring mixing structure may include first to eighth B pads. Output terminals of the second wiring mixing structure may include first to eighth C pads. The first B pad may be connected to the first C pad. The second B pad may be connected to the fourth C pad. The third B pad may be connected to the third C pad. The fourth B pad may be connected to the second C pad. The fifth B pad may be connected to the seventh C pad. The sixth B pad may be connected to the sixth C pad. The seventh B pad may be connected to the fifth C pad. The eighth B pad may be connected to the eighth C pad.

In an embodiment, input terminals of the first wiring mixing structure may include first to eighth A pads. Output terminals of the first wiring mixing structure may include first to eighth B pads. Input terminals of the second wiring mixing structure may include the first to eighth B pads. Output terminals of the second wiring mixing structure may include first to eighth C pads. The first A pad may be connected to the first B pad. The second A pad may be connected to the third B pad. The third A pad may be connected to the fourth B pad. The fourth A pad may be connected to the second B pad. The fifth A pad may be connected to the seventh B pad. The sixth A pad may be connected to the fifth B pad. The seventh A pad may be connected to the sixth B pad. The eighth A pad may be connected to the eighth B pad. The first B pad may be connected to the first C pad. The second B pad may be connected to the fourth C pad. The third B pad may be connected to the third C pad. The fourth B pad may be connected to the second C pad. The fifth B pad may be connected to the seventh C pad. The sixth B pad may be connected to the sixth C pad. The seventh B pad may be connected to the fifth C pad. The eighth B pad may be connected to the eighth C pad.

In an embodiment, the first, the fourth, the fifth, the eighth, a ninth, a twelfth, a thirteenth and a sixteenth output lines of the demux circuit may be activated by a first switching signal. The second, the third, the sixth, the seventh, a tenth, an eleventh, a fourteenth and a fifteenth output lines of the demux circuit may be activated by a second switching signal.

In an embodiment, the data driver may further include fifth to eighth output amplifiers. When the first order of first output data generated by alternately demuxing the first to eighth output amplifiers is 1, 2, 3, 4, 5, 6, 7, 8, 9, 10, 11, 12, 13, 14, 15 and 16, a second order of second output data of the demux circuit may be 1, 2, 4, 3, 5, 6, 8, 7, 9, 10, 12, 11, 13, 14, 16 and 15.

In an embodiment, when the second order which is an order of prior data of the first wiring mixing structure is 1, 2, 4, 3, 5, 6, 8, 7, 9, 10, 12, 11, 13, 14, 16 and 15, a third order which is an order of after data of the first wiring mixing structure may be 1, 3, 5, 7, 2, 4, 6, 8, 10, 12, 14, 16, 9, 11, 13 and 15.

In an embodiment, when the third order which is an order of prior data of the second wiring mixing structure is 1, 3, 5, 7, 2, 4, 6, 8, 10, 12, 14, 16, 9, 11, 13 and 15, the final order which is an order of after data of the second wiring mixing structure may be 1, 4, 2, 3, 5, 8, 6, 7, 9, 12, 10, 11, 13, 16, 14 and 15.

In an embodiment, input terminals of the first wiring mixing structure may include first to sixteenth A pads. Output terminals of the first wiring mixing structure may include first to sixteenth B pads. The first A pad may be connected to the first B pad. The second A pad may be connected to the fifth B pad. The third A pad may be connected to the sixth B pad. The fourth A pad may be connected to the second B pad. The fifth A pad may be connected to the third B pad.

The sixth A pad may be connected to the seventh B pad. The seventh A pad may be connected to the eighth B pad. The eighth A pad may be connected to the fourth B pad. The ninth A pad may be connected to the thirteenth B pad. The tenth A pad may be connected to the ninth B pad. The eleventh A pad may be connected to the tenth B pad. The twelfth A pad may be connected to the fourteenth B pad. The thirteenth A pad may be connected to the fifteenth B pad. The fourteenth A pad may be connected to the eleventh B pad. The fifteenth A pad may be connected to the twelfth B pad. The sixteenth A pad may be connected to the sixteenth B pad.

In an embodiment, input terminals of the second wiring mixing structure may include first to sixteenth B pads. Output terminals of the second wiring mixing structure may include first to sixteenth C pads. The first B pad may be connected to the first C pad. The second B pad may be connected to the fourth C pad. The third B pad may be connected to the fifth C pad. The fourth B pad may be connected to the eighth C pad. The fifth B pad may be connected to the third C pad. The sixth B pad may be connected to the second C pad. The seventh B pad may be connected to the seventh C pad. The eighth B pad may be connected to the sixth C pad. The ninth B pad may be connected to the eleventh C pad. The tenth B pad may be connected to the tenth C pad. The eleventh B pad may be connected to the fifteenth C pad. The twelfth B pad may be connected to the fourteenth C pad. The thirteenth B pad may be connected to the ninth C pad. The fourteenth B pad may be connected to the twelfth C pad. The fifteenth B pad may be connected to the thirteenth C pad. The sixteenth B pad may be connected to the sixteenth C pad.

In an embodiment, input terminals of the first wiring mixing structure may include first to sixteenth A pads. Output terminals of the first wiring mixing structure may include first to sixteenth B pads. Input terminals of the second wiring mixing structure may include first to sixteenth B pads. Output terminals of the second wiring mixing structure may include first to sixteenth C pads. The first A pad may be connected to the first B pad. The second A pad may be connected to the fifth B pad. The third A pad may be connected to the sixth B pad. The fourth A pad may be connected to the second B pad. The fifth A pad may be connected to the third B pad.

The sixth A pad may be connected to the seventh B pad. The seventh A pad may be connected to the eighth B pad. The eighth A pad may be connected to the fourth B pad. The ninth A pad may be connected to the thirteenth B pad. The tenth A pad may be connected to the ninth B pad. The eleventh A pad may be connected to the tenth B pad. The twelfth A pad may be connected to the fourteenth B pad. The thirteenth A pad may be connected to the fifteenth B pad. The fourteenth A pad may be connected to the eleventh B pad. The fifteenth A pad may be connected to the twelfth B pad. The sixteenth A pad may be connected to the sixteenth B pad. The first B pad may be connected to the first C pad. The second B pad may be connected to the fourth C pad. The third B pad may be connected to the fifth C pad. The fourth B pad may be connected to the eighth C pad. The fifth B pad may be connected to the third C pad. The sixth B pad may be connected to the second C pad. The seventh B pad may be connected to the seventh C pad. The eighth B pad may be connected to the sixth C pad. The ninth B pad may be connected to the eleventh C pad. The tenth B pad may be connected to the tenth C pad. The eleventh B pad may be connected to the fifteenth C pad. The twelfth B pad may be connected to the fourteenth C pad. The thirteenth B pad may be connected to the ninth C pad. The fourteenth B pad may be connected to the twelfth C pad.

The fifteenth B pad may be connected to the thirteenth C pad. The sixteenth B pad may be connected to the sixteenth C pad.

In an embodiment of a display apparatus according to the present inventive concept, the display apparatus includes a data driver, a demux circuit, a first wiring mixing structure, a second wiring mixing structure and a display panel. The data driver includes first to fourth output amplifiers. The demux circuit is configured to branch the first to fourth output amplifiers to first to eighth output lines through demux switching. The first wiring mixing structure is connected to the demux circuit. The second wiring mixing structure is connected to the first wiring mixing structure. The display panel includes data lines connected to the second wiring mixing structure. When a first order of first output data generated by alternately demuxing the first to fourth output amplifiers is 1, 2, 3, 4, 5, 6, 7 and 8, a final order of final output data outputted by the second wiring mixing structure may be 1, 4, 2, 3, 5, 8, 6 and 7.

In an embodiment of an electronic apparatus according to the present inventive concept, the electronic apparatus includes a data driver, a demux circuit, a first wiring mixing structure, a second wiring mixing structure, a display panel, a driving controller and a processor. The data driver includes first to fourth output amplifiers. The demux circuit is configured to branch the first to fourth output amplifiers to first to eighth output lines through demux switching. The first wiring mixing structure is connected to the demux circuit. The second wiring mixing structure is connected to the first wiring mixing structure. The display panel includes data lines connected to the second wiring mixing structure. The driving controller is configured to control the data driver. The processor is configured to output input image data and an input control signal to the driving controller.

According to the display apparatus and the electronic apparatus including the display apparatus, the display apparatus may support the four-bundle demux switching structure and include the wire mixing structure for preventing the data mapping error so that the demux coupling may be enhanced and the data mapping error may be prevented.

In addition, the display apparatus may support the eight-bundle demux switching structure and include the wire mixing structure for preventing the data mapping error so that the demux coupling may be enhanced and the data mapping error may be prevented.

In addition, the display apparatus may support the four-bundle demux switching structure and the eight-bundle demux switching structure without changing the integrated circuit of the data driver and the active area of the display panel.

In addition, the data driver may be formed in the border reduction structure in which the data voltage applied to the data line at the center of the display panel and the data voltage applied to the data line at the edge of the display panel are alternatively outputted so that the dead space of the display apparatus may be reduced.

In addition, the demux circuit is disposed adjacent to the integrated circuit area on the second side of the bending line so that the dead space of the display apparatus may be further reduced.

BRIEF DESCRIPTION OF THE DRAWINGS

The above and other features and advantages of the present inventive concept will become more apparent by describing in detailed embodiments thereof with reference to the accompanying drawings, in which:

FIG. 4 is a table illustrating an output amplifier of the data driver of FIG. 1 and data mapping of the data driver of FIG. 1;

FIG. 5 is a table illustrating the output amplifier of the data driver of FIG. 1 and the data mapping of the data driver of FIG. 1 when a demux switching is A-B-A-B;

FIG. 6 is a table illustrating the output amplifier of the data driver of FIG. 1 and the data mapping of the data driver of FIG. 1 when a demux switching is A-B-B-A;

FIG. 7 is a table illustrating the output amplifier of the data driver of FIG. 1 and the data mapping of the data driver of FIG. 1 when a demux switching is A-A-B-B-B-B-A-A (four-bundle);

FIG. 8 is a table illustrating a data structure of the display panel of FIG. 1;

FIG. 11 is a table illustrating an output amplifier of the data driver of FIG. 1 and data mapping of the data driver of FIG. 1;

FIG. 12 is a table illustrating the output amplifier of the data driver of FIG. 1 and the data mapping of the data driver of FIG. 1 when a demux switching is A-A-B-B-B-B-A-A (four-bundle);

FIG. 13 is a table illustrating an output amplifier of the data driver of FIG. 1 and data mapping of the data driver of FIG. 1;

FIG. 14 is a table illustrating the output amplifier of the data driver of FIG. 1 and the data mapping of the data driver of FIG. 1 when a demux switching is A-B-A-B;

FIG. 15 is a table illustrating the output amplifier of the data driver of FIG. 1 and the data mapping of the data driver of FIG. 1 when a demux switching is A-B-B-A;

FIG. 16 is a table illustrating the output amplifier of the data driver of FIG. 1 and the data mapping of the data driver of FIG. 1 when a demux switching is A-A-A-A-B-B-B-B-B-B-B-B-A-A-A-A (eight-bundle);

FIG. 17 is a table illustrating a data structure of the display panel of FIG. 1;

DETAILED DESCRIPTION OF THE INVENTIVE CONCEPT

Hereinafter, the present inventive concept will be explained in detail with reference to the accompanying drawings.

Figure 1:
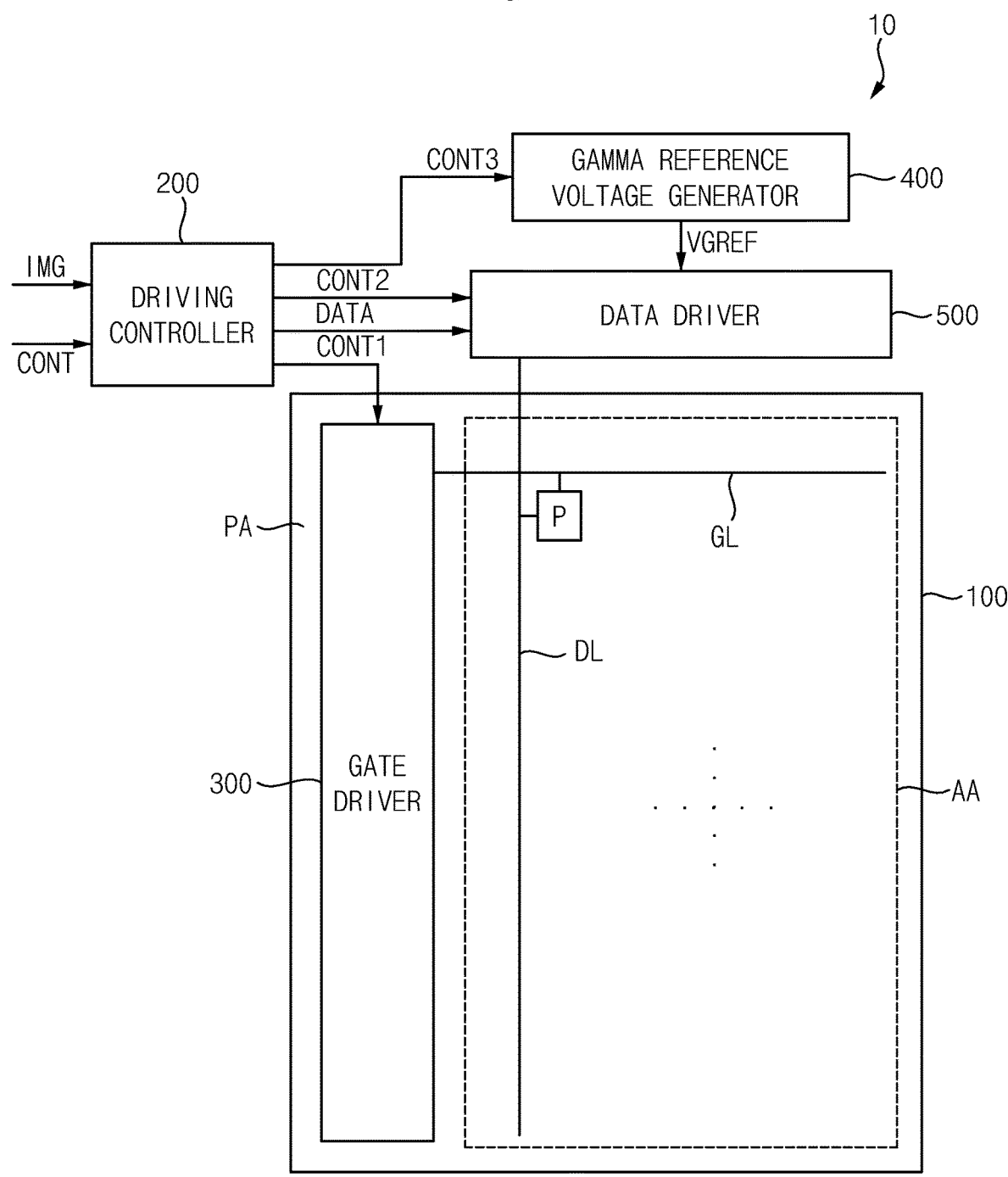
FIG. 1 is a block diagram illustrating a display apparatus according to an embodiment of the present inventive concept.

FIG. 1 is a block diagram illustrating a display apparatus according to an embodiment of the present inventive concept.

Referring to FIG. 1, the display apparatus 10 includes a display panel 100 and a display panel driver. The display panel driver includes a driving controller 200, a gate driver 300, a gamma reference voltage generator 400 and a data driver 500.

For example, the driving controller 200 and the data driver 500 may be integrally formed. For example, the driving controller 200, the gamma reference voltage generator 400 and the data driver 500 may be integrally formed. A driving module including at least the driving controller 200 and the data driver 500 which are integrally formed may be called to a timing controller embedded data driver (TED).

The display panel 100 has a display region AA on which an image is displayed and a peripheral region PA adjacent to the display region AA.

The display panel 100 includes a plurality of gate lines GL, a plurality of data lines DL and a plurality of pixels P connected to the gate lines GL and the data lines DL. The gate lines GL may extend in a first direction D1. The data lines DL may extend in the second direction D2 crossing the first direction D1.

The driving controller 200 receives input image data IMG and an input control signal CONT from an external apparatus. The input image data IMG may include red image data, green image data and blue image data. The input image data IMG may include white image data. The input image data IMG may include magenta image data, yellow image data and cyan image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may further include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the driving controller 200. The gate driver 300 outputs the gate signals to the gate lines GL. For example, the gate driver 300 may sequentially output the gate signals to the gate lines GL. For example, the gate driver 300 may be mounted on the peripheral region PA of the display panel 100. For example, the gate driver 300 may be integrated on the peripheral region PA of the display panel 100.

The gamma reference voltage generator 400 generates a gamma reference voltage VGREF in response to the third control signal CONT3 received from the driving controller 200.

The gamma reference voltage generator 400 provides the gamma reference voltage VGREF to the data driver 500. The gamma reference voltage VGREF has a value corresponding to a level of the data signal DATA.

In an embodiment, the gamma reference voltage generator 400 may be disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

Figure 2:
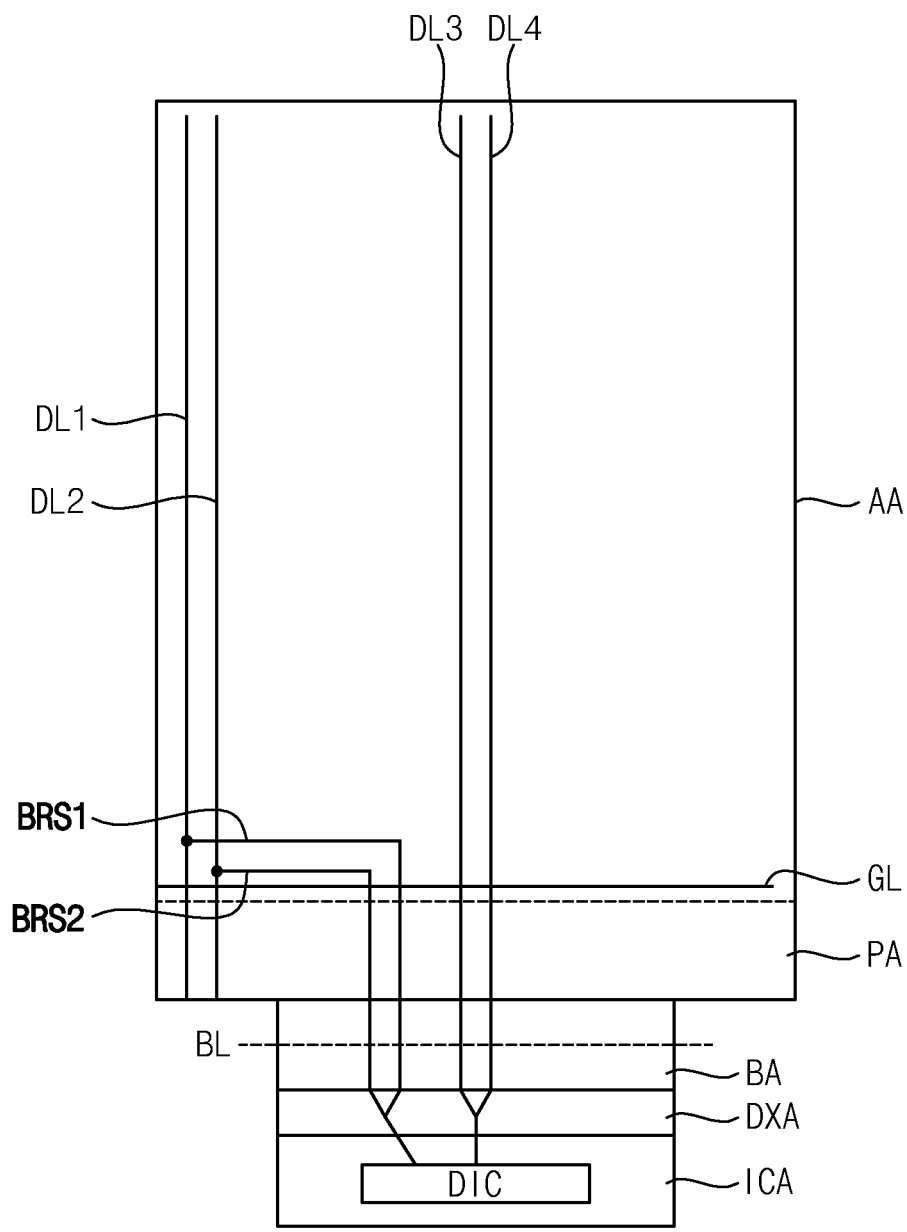
FIG. 2 is a conceptual diagram illustrating a display panel and a data driver of FIG. 1.

FIG. 2 is a conceptual diagram illustrating the display panel 100 and the data driver 500 of FIG. 1.

Referring to FIGS. 1 and 2, the display panel 100 may include the display region AA and the peripheral region PA. The peripheral region PA of the display panel 100 may be connected to a bending area BA. The bending area BA may include a bending line BL for folding elements toward a rear surface of the display panel 100. The bending area BA may be disposed between the display panel 100 and the data driver 500.

The data driver 500 may be formed as a type of a data driving chip DIC. The data driving chip DIC may be disposed in an integrated circuit area ICA of the data driver 500.

The display apparatus may further include a demux circuit DXA. The demux circuit DXA may be disposed between the integrated circuit area ICA and the bending area BA.

The display panel 100 is disposed on a first side of the bending line BL. The demux circuit DXA and the integrated circuit area ICA may be disposed on a second side of the bending line BL. The demux circuit DXA and the integrated circuit area ICA may be folded toward the rear surface of the display panel 100. In the present embodiment, the demux circuit DXA is folded toward the rear surface of the display panel 100 so that a dead space of the display apparatus may be reduced compared to a case where the demux circuit DXA is disposed in the peripheral area PA of the display panel 100.

The data driver 500 may have a border reduction structure in which a data voltage applied to a data line (e.g. DL3 and DL4) at a center of the display panel 100 and a data voltage applied to a data line (e.g. DL1 and DL2) at an edge of the display panel 100 are alternatively outputted. The display panel 100 may further include a horizontal line BRS1 and BRS2 to transmit the data voltage to the data line (e.g. DL1 and DL2) at the edge of the display panel 100.

Figure 3:
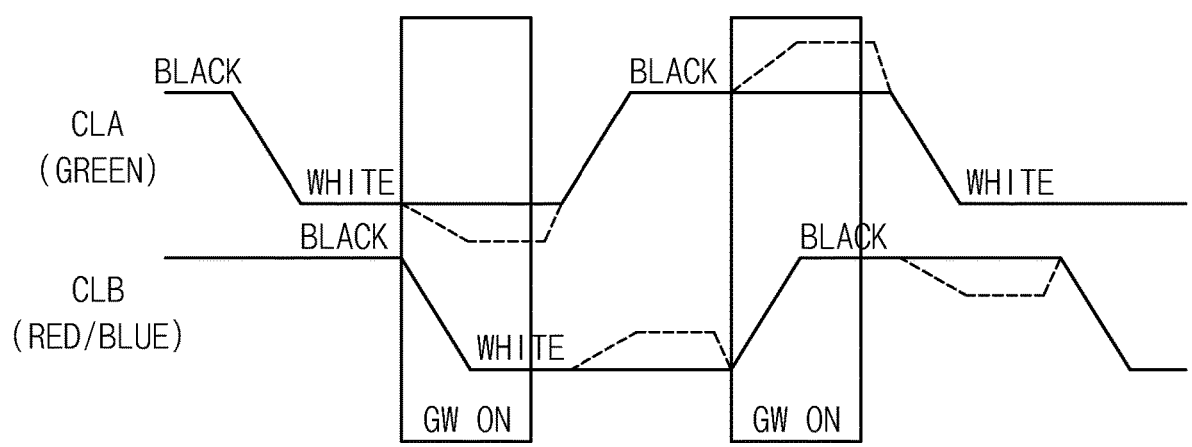
FIG. 3 is a diagram illustrating an example in which coupling occurs in a demux switching structure.

FIG. 3 is a diagram illustrating an example in which coupling occurs in a demux switching structure.

Referring to FIGS. 1 to 3, CLA in FIG. 3 indicates a switching signal of a first switch of the demux circuit DXA and CLB in FIG. 3 indicates a switching signal of a second switch of the demux circuit DXA. FIG. 3 illustrates that CLA outputs green pixel data and CLB outputs red and blue pixel data. Alternatively, CLA may output red and blue pixel data and CLB may output green pixel data.

According to an embodiment, a timing GW ON at which the gate signal is turned on may be synchronized with a timing at which CLA maintains a low level or a high level and a timing at which CLB changed from a high level to a low level or from a low level to a high level.

Accordingly, when the display panel 100 displays a zebra pattern, the luminance of the green pixel may become brighter (as indicated by a dotted line) due to coupling at the first GW ON timing so that the image may become greenish.

As such, when a data output path synchronized with CLA and a data output path synchronized with CLB are disposed adjacent to each other, a display quality of the display panel 100 may be deteriorated due to the data coupling.

Figure 9:
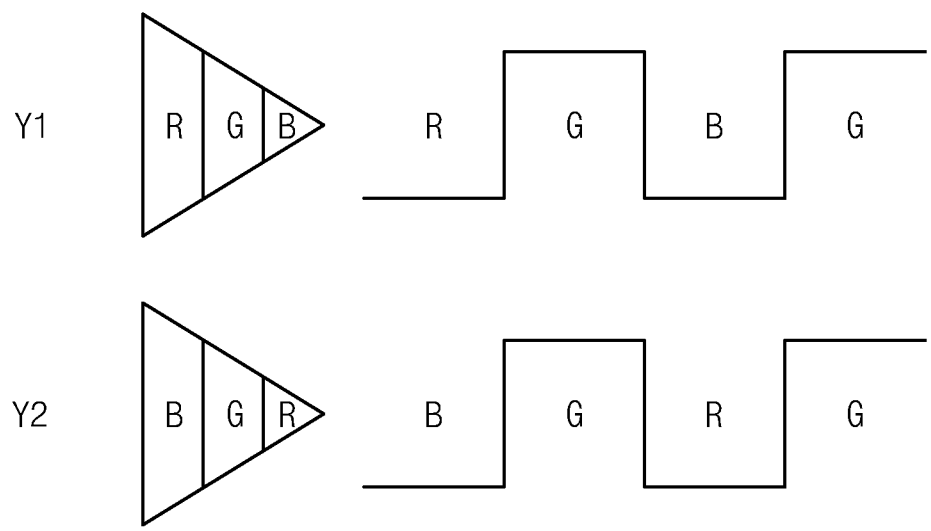
FIG. 9 is a diagram illustrating the output amplifier of the data driver of FIG. 1.
Figure 10:
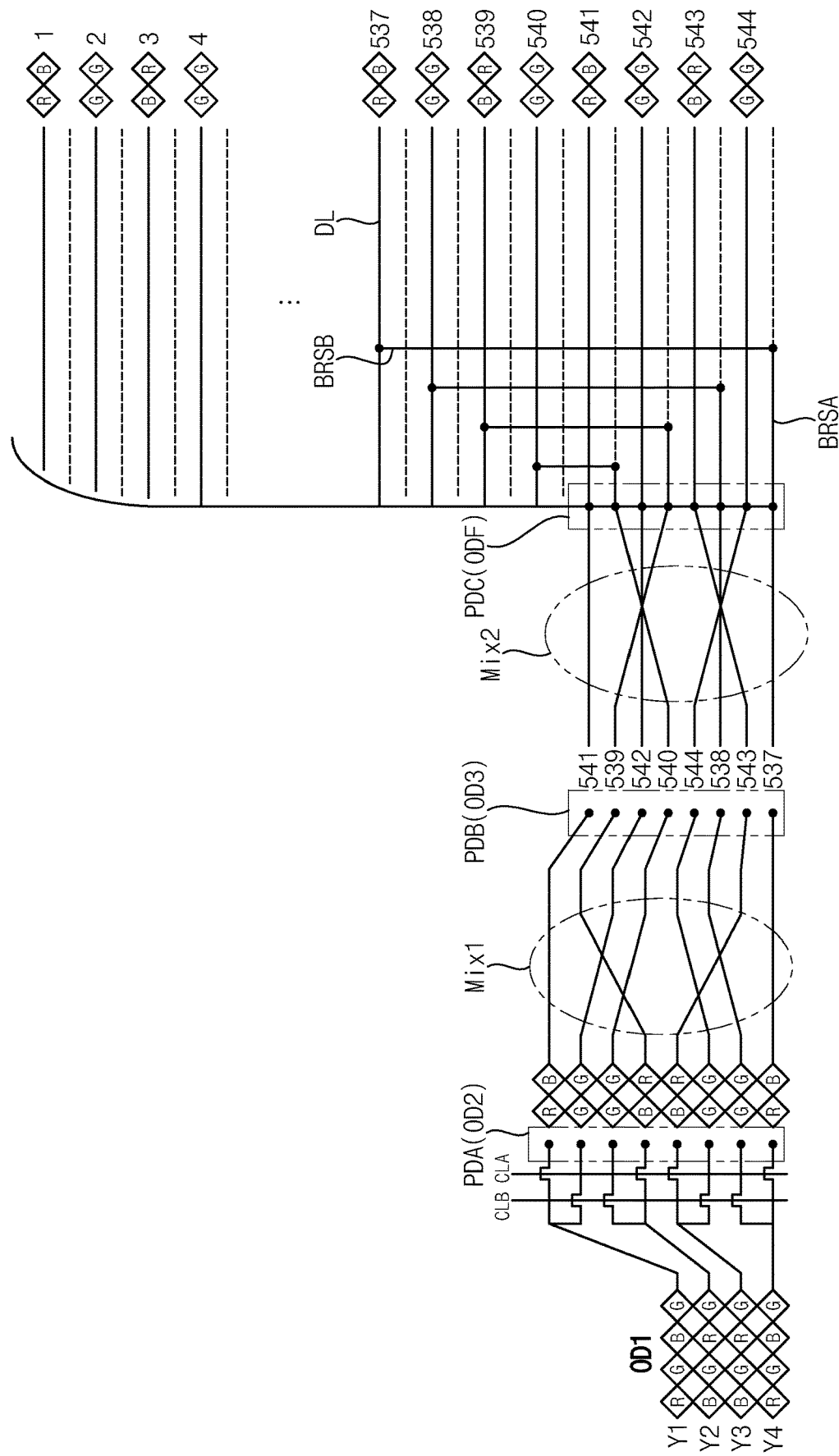
FIG. 10 is a conceptual diagram illustrating an output amplifier of a data driver of FIG. 1, a demux circuit, a first wiring mixing structure, a second wiring mixing structure and the display panel.

FIG. 4 is a table illustrating an output amplifier of the data driver 500 of FIG. 1 and data mapping of the data driver 500 of FIG. 1. FIG. 5 is a table illustrating the output amplifier of the data driver 500 of FIG. 1 and the data mapping of the data driver 500 of FIG. 1 when a demux switching is A-B-A-B. FIG. 6 is a table illustrating the output amplifier of the data driver 500 of FIG. 1 and the data mapping of the data driver 500 of FIG. 1 when a demux switching is A-B-B-A. FIG. 7 is a table illustrating the output amplifier of the data driver 500 of FIG. 1 and the data mapping of the data driver 500 of FIG. 1 when a demux switching is A-A-B-B-B-B-A-A (four-bundle). FIG. 8 is a table illustrating a data structure of the display panel 100 of FIG. 1. FIG. 9 is a diagram illustrating the output amplifier of the data driver 500 of FIG. 1. FIG. 10 is a conceptual diagram illustrating the output amplifier of the data driver 500 of FIG. 1, a demux circuit, a first wiring mixing structure, a second wiring mixing structure and the display panel 100. FIG. 11 is a table illustrating an output amplifier of the data driver 500 of FIG. 1 and data mapping of the data driver 500 of FIG. 1. FIG. 12 is a table illustrating the output amplifier of the data driver 500 of FIG. 1 and the data mapping of the data driver 500 of FIG. 1 when a demux switching is A-A-B-B-B-B-A-A (four-bundle).

Referring to FIGS. 1 to 12, the display apparatus includes the data driver 500, the demux circuit DXA, a first wiring mixing structure Mix1, a second wiring mixing structure Mix2 and the display panel 100. In the present embodiment, the demux switching may be a four-bundle structure of A-A-B-B-B-B-A-A. In FIGS. 4 to 12, CLA may correspond to the red and blue pixel data and CLB may correspond to the green pixel data. As shown in FIG. 7, the demux switching structure may be repeated in a unit of "A-A-B-B-B-B-A-A." For example, when the demux switching structure is repeated twice or more in the unit of "A-A-B-B-B-B-A-A", the demux switching structure may be "A-A-B-B-B-B-A-A-A-A-B-B-B-B-A-A . . . " In this case, except for a beginning part, four of the data (R-B data) corresponding to CLA are continuously disposed and four of the data (G-G data) corresponding to CLB are continuously disposed so that the image quality deterioration due to the data coupling between the data corresponding to CLA and the data corresponding to CLB may be relatively reduced.

For example, the data driver 500 includes first to fourth output amplifiers Y1, Y2, Y3 and Y4.

The demux circuit DXA may branch the first to fourth output amplifiers Y1, Y2, Y3, and Y4 to first to eighth output lines through demux switching.

The first wiring mixing structure Mix1 is connected to the demux circuit DXA. The second wiring mixing structure Mix2 is connected to the first wiring mixing structure Mix1. The display panel 100 includes data lines DL connected to the second wiring mixing structure Mix2.

In the present embodiment, when a first order Order1 (OD1) of first output data generated by alternately demuxing the first to fourth output amplifiers Y1, Y2, Y3 and Y4 is 1, 2, 3, 4, 5, 6, 7 and 8, a final order ODF of final output data outputted by the second wiring mixing structure Mix2 may be 1, 4, 2, 3, 5, 8, 6 and 7.

Alternately demuxing the first to fourth output amplifiers Y1, Y2, Y3 and Y4 may mean that R-B data of R-G-B-G data of the first output amplifier Y1 is set as a number one order of the first output data, G-G data of the R-G-B-G data of the first output amplifier Y1 is set as a number two order of the first output data, B-R data of B-G-R-G data of the second output amplifier Y2 is set as a number three order of the first output data, G-G data of the B-G-R-G data of the second output amplifier Y2 is set as a number four order of the first output data, B-R data of B-G-R-G data of the third output amplifier Y3 is set as a number five order of the first output data, G-G data of the B-G-R-G data of the third output amplifier Y3 is set as a number six order of the first output data, R-B data of R-G-B-G data of the fourth output amplifier Y4 is set as a number seven order of the first output data, and G-G data of the R-G-B-G data of the fourth output amplifier Y4 is set as a number eighth order of the first output data. In the first order Order1 (OD1), the number one to eight orders may be R-B data, G-G data, B-R data, G-G data, B-R data, G-G data, R-B data and G-G data respectively.

As shown in FIG. 4, the data lines corresponding to the R-G-B-G data of the first output amplifier Y1 may be 541 and 542 data lines. Among the data of the first output amplifier Y1, colors of the data demuxed by CLA signal are R-B (R at a first scan timing and B at a second scan timing), and these data may be applied to the 541 data line. Among the data of the first output amplifier Y1, colors of the data demuxed by CLB signal are G-G, and these data may be applied to the 542 data line.

The data lines corresponding to the B-G-R-G data of the second output amplifier Y2 may be 539 and 540 data lines. Among the data of the second output amplifier Y2, colors of the data demuxed by CLA signal are B-R (B at a first scan timing and R at a second scan timing), and these data may be applied to the 539 data line. Among the data of the second output amplifier Y2, colors of the data demuxed by CLB signal are G-G, and these data may be applied to the 540 data line.

The data lines corresponding to the B-G-R-G data of the third output amplifier Y3 may be 543 and 544 data lines. Among the data of the third output amplifier Y3, colors of the data demuxed by CLA signal are B-R (B at a first scan timing and R at a second scan timing), and these data may be applied to the 543 data line. Among the data of the third output amplifier Y3, colors of the data demuxed by CLB signal are G-G, and these data may be applied to the 544 data line.

The data lines corresponding to the R-G-B-G data of the fourth output amplifier Y4 may be 537 and 538 data lines. Among the data of the fourth output amplifier Y4, colors of the data demuxed by CLA signal are R-B (R at a first scan timing and B at a second scan timing), and these data may be applied to the 537 data line. Among the data of the fourth output amplifier Y4, colors of the data demuxed by CLB signal are G-G, and these data may be applied to the 538 data line.

1, 2, 3, 4, 5, 6, 7 and 8 which is the first order Order1 (OD1) of first output data generated by alternately demuxing the first to fourth output amplifiers Y1, Y2, Y3 and Y4 may be data applied to the data lines 541, 542, 539, 540, 543, 544, 537 and 538 of the display region AA of the display panel 100. This corresponding relationship remains the same in the embodiment regardless of the wiring mixing.

Some of the output data of the data driver 500 may be normal data directly applied to the data lines of the display panel 100. Some of the output data of the data driver 500 may be border reduction data applied to the data lines of the display panel 100 through border reduction horizontal lines. In the present embodiment, the data corresponding to 1 to 540 data lines may be the border reduction data. The data corresponding to 541 or greater data lines may be the normal data.

When the first order Order1 (OD1) of the first output data generated by alternately demuxing the first to fourth output amplifiers Y1, Y2, Y3 and Y4 is 1, 2, 3, 4, 5, 6, 7 and 8, the first output data (corresponding to the 541, 542, 543 and 544 data lines) having the number one order, the number two order, the number five order and the number six order may be the normal data and the first output data (corresponding to the 539, 540, 537 and 538 data lines) having the number three order, the number four order, the number seven order and the number eight order may be the border reduction data.

Referring to the demux circuit of FIG. 10 and the table of FIG. 6, first, fourth, fifth and eighth output lines of the demux circuit may be activated by the first switching signal CLA. Second, third, sixth and seventh output lines of the demux circuit may be activated by the second switching signal CLB.

In this structure, the data corresponding to CLA and the data corresponding to CLB may be continuously disposed by two as shown in "Switch" column of FIG. 6. Herein, 1, 2, 3, 4, 5, 6, 7 and 8 which is the first order Order1 (OD1) of the first output data may be changed to 1, 2, 4, 3, 5, 6, 8 and 7 which is the second order Order2 (OD2) for the demux switching.

When the first order Order1 (OD1) of first output data generated by alternately demuxing the first to fourth output amplifiers Y1, Y2, Y3 and Y4 is 1, 2, 3, 4, 5, 6, 7 and 8, a second order Order2 (OD2) of second output data of the demux circuit may be 1, 2, 4, 3, 5, 6, 8 and 7.

As shown in FIG. 10, in the second order Order2 (OD2), a number one order to a number eight order may be R-B data, G-G data, G-G data, B-R data, B-R data, G-G data, G-G data and R-B data.

In FIG. 10, the second order Order2 (OD2) of 1, 2, 4, 3, 5, 6, 8 and 7 may be an order of prior data of the first wiring mixing structure Mix1.

Input terminals of the first wiring mixing structure Mix1 may include first to eighth A pads PDA and output terminals of the first wiring mixing structure Mix1 may include first to eighth B pads PDB.

Herein, the first A pad may be connected to the first B pad. The second A pad may be connected to the third B pad. The third A pad may be connected to the fourth B pad. The fourth A pad may be connected to the second B pad. The fifth A pad may be connected to the seventh B pad. The sixth A pad may be connected to the fifth B pad. The seventh A pad may be connected to the sixth B pad. The eighth A pad may be connected to the eighth B pad.

When the second order Order2 (OD2) which is the order of the prior data of the first wiring mixing structure Mix1 is 1, 2, 4, 3, 5, 6, 8 and 7, a third order Order3 (OD3) which is an order of after data of the first wiring mixing structure Mix1 may be 1, 3, 2, 4, 6, 8, 5 and 7 by the first wiring mixing structure Mix1.

In FIG. 6, the data corresponding to CLA and the data corresponding to CLB may be continuously disposed by two. In FIG. 7, the data corresponding to CLA and the data corresponding to CLB may be continuously disposed by four by the first wiring mixing structure Mix1. The four-bundle structure may be implemented by the first wiring mixing structure Mix1.

Input terminals of the second wiring mixing structure Mix2 may include the first to eighth B pads PDB and output terminals of the second wiring mixing structure Mix2 may include first to eighth C pads PDC.

Herein, the first B pad may be connected to the first C pad. The second B pad may be connected to the fourth C pad. The third B pad may be connected to the third C pad. The fourth B pad may be connected to the second C pad. The fifth B pad may be connected to the seventh C pad. The sixth B pad may be connected to the sixth C pad. The seventh B pad may be connected to the fifth C pad. The eighth B pad may be connected to the eighth C pad.

When the third order Order3 (OD3) which is the order of prior data of the second wiring mixing structure Mix2 is 1, 3, 2, 4, 6, 8, 5 and 7, the final order ODF which is an order of after data of the second wiring mixing structure Mix2 may be 1, 4, 2, 3, 5, 8, 6 and 7 by the second wiring mixing structure Mix2.

The data mapping errors in the four-bundle structure may be prevented by the second wiring mixing structure Mix2.

As shown in FIG. 10, the data corresponding to the 541, 542, 543 and 544 data lines are the normal data directly outputted to the data lines DL. In contrast, the data corresponding to the 537, 538, 539 and 540 data lines are the border reduction data outputted to the data lines DL through a first border reduction line BRSA, a first contact hole, a second border reduction line BRSB and a second contact hole.

According to the present embodiment, the display apparatus may support the four-bundle demux switching structure and include the wire mixing structures Mix1 and Mix2 for preventing the data mapping error so that the demux coupling may be enhanced and the data mapping error may be prevented.

In addition, the display apparatus may support the four-bundle demux switching structure and the eight-bundle demux switching structure without changing the integrated circuit ICA of the data driver 500 and the display region AA of the display panel 100.

In addition, the data driver 500 may be formed in the border reduction structure in which the data voltage applied to the data line at the center of the display panel 100 and the data voltage applied to the data line at the edge of the display panel 100 are alternatively outputted so that the dead space of the display apparatus may be reduced.

In addition, the demux circuit DXA is disposed adjacent to the integrated circuit area ICA on the second side of the bending line BL so that the dead space of the display apparatus may be further reduced.

Figure 18:
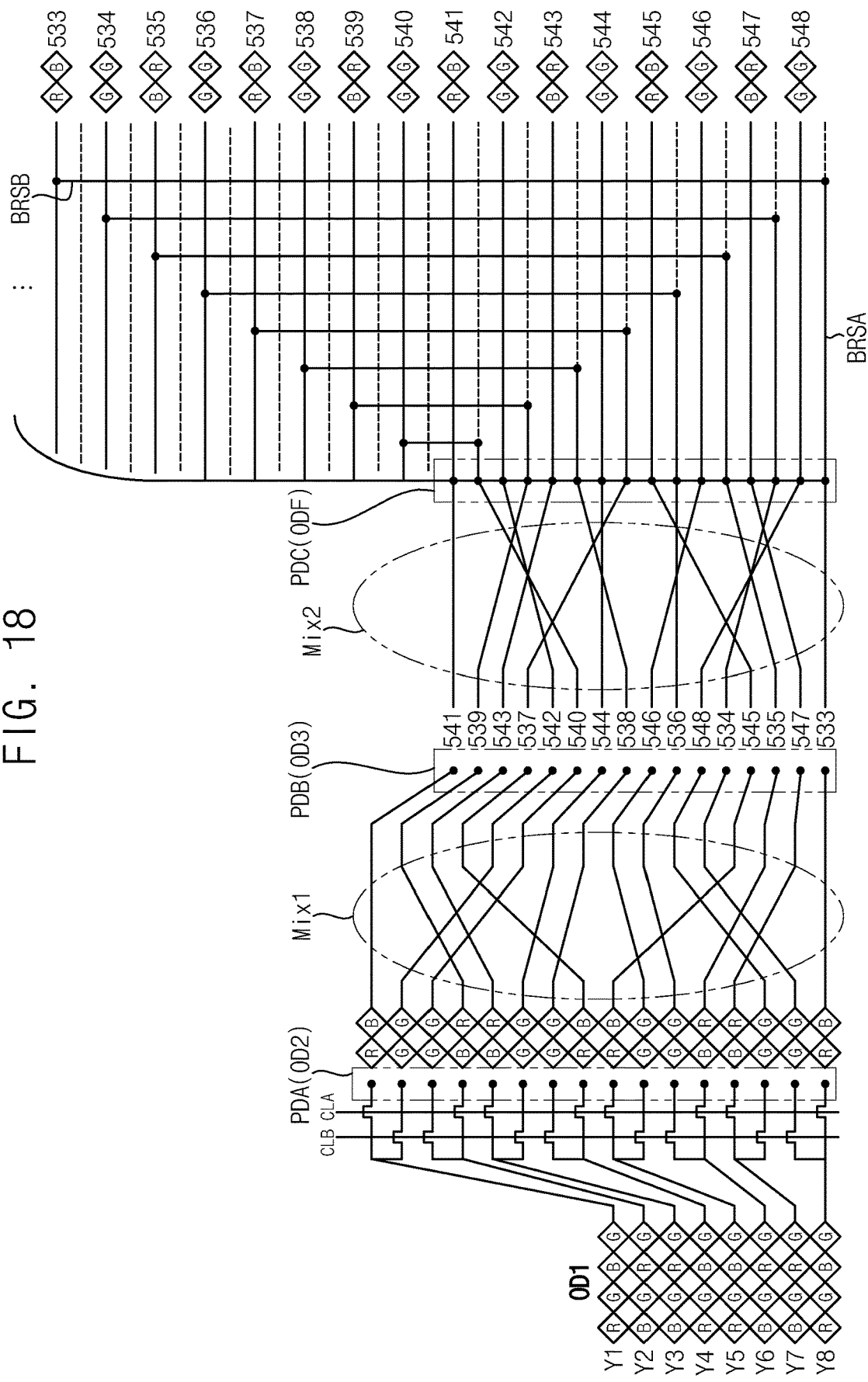
FIG. 18 is a conceptual diagram illustrating an output amplifier of the data driver of FIG. 1, a demux circuit, a first wiring mixing structure, a second wiring mixing structure and the display panel.

FIG. 13 is a table illustrating an output amplifier of the data driver 500 of FIG. 1 and data mapping of the data driver 500 of FIG. 1. FIG. 14 is a table illustrating the output amplifier of the data driver of FIG. 1 and the data mapping of the data driver 500 of FIG. 1 when a demux switching is A-B-A-B. FIG. 15 is a table illustrating the output amplifier of the data driver 500 of FIG. 1 and the data mapping of the data driver 500 of FIG. 1 when a demux switching is A-B-B-A. FIG. 16 is a table illustrating the output amplifier of the data driver 500 of FIG. 1 and the data mapping of the data driver 500 of FIG. 1 when a demux switching is A-A-A-A-B-B-B-B-B-B-B-B-A-A-A-A (eight-bundle). FIG. 17 is a table illustrating a data structure of the display panel 100 of FIG. 1. FIG. 18 is a conceptual diagram illustrating an output amplifier of the data driver 500 of FIG. 1, a demux circuit, a first wiring mixing structure, a second wiring mixing structure and the display panel.

Referring to FIGS. 1 to 3 and 13 to 18, the display apparatus includes the data driver 500, the demux circuit DXA, a first wiring mixing structure Mix1, a second wiring mixing structure Mix2 and the display panel 100. In the present embodiment, the demux switching may be an eight-bundle structure of A-A-A-A-B-B-B-B-B-B-B-B-A-A-A-A. In FIGS. 13 to 18, CLA may correspond to the red and blue pixel data and CLB may correspond to the green pixel data. As shown in FIG. 16, the demux switching structure may be repeated in a unit of "A-A-A-A-B-B-B-B-B-B-B-B-A-A-A-A." For example, when the demux switching structure is repeated twice or more in the unit of "A-A-A-A-B-B-B-B-B-B-B-B-A-A-A-A", the demux switching structure may be "A-A-A-A-B-B-B-B-B-B-B-B-A-A-A-A-A-A-A-A-B-B-B-B-B-B-B-B-A-A-A-A . . . " In this case, except for a beginning part, eight of the data (R-B data) corresponding to CLA are continuously disposed and eight of the data (G-G data) corresponding to CLB are continuously disposed so that the image quality deterioration due to the data coupling between the data corresponding to CLA and the data corresponding to CLB may be relatively reduced.

For example, the data driver 500 includes first to eighth output amplifiers Y1, Y2, Y3, Y4, Y5, Y6, Y7 and Y8.

The demux circuit DXA may branch the first to eighth output amplifiers Y1, Y2, Y3, Y4, Y5, Y6, Y7 and Y8 to first to sixteenth output lines through demux switching.

The first wiring mixing structure Mix1 is connected to the demux circuit DXA. The second wiring mixing structure Mix2 is connected to the first wiring mixing structure Mix1. The display panel 100 includes data lines DL connected to the second wiring mixing structure Mix2.

In the present embodiment, when a first order Order1 (OD1) of first output data generated by alternately demuxing the first to eighth output amplifiers Y1, Y2, Y3, Y4, Y5, Y6, Y7 and Y8 is 1, 2, 3, 4, 5, 6, 7, 8, 9, 10, 11, 12, 13, 14, 15 and 16 a final order ODF of final output data outputted by the second wiring mixing structure may be 1, 4, 2, 3, 5, 8, 6, 7, 9, 10, 12, 11, 13, 14, 16 and 15.

Alternately demuxing the first to eighth output amplifiers Y1, Y2, Y3, Y4, Y5, Y6, Y7 and Y8 may mean that R-B data of R-G-B-G data of the first output amplifier Y1 is set as a number one order of the first output data, G-G data of the R-G-B-G data of the first output amplifier Y1 is set as a number two order of the first output data, B-R data of B-G-R-G data of the second output amplifier Y2 is set as a number three order of the first output data, G-G data of the B-G-R-G data of the second output amplifier Y2 is set as a number four order of the first output data, B-R data of B-G-R-G data of the third output amplifier Y3 is set as a number five order of the first output data, G-G data of the B-G-R-G data of the third output amplifier Y3 is set as a number six order of the first output data, R-B data of R-G-B-G data of the fourth output amplifier Y4 is set as a number seven order of the first output data, G-G data of the R-G-B-G data of the fourth output amplifier Y4 is set as a number eight order of the first output data, R-B data of R-G-B-G data of the fifth output amplifier Y5 is set as a number nine order of the first output data, G-G data of the R-G-B-G data of the fifth output amplifier Y5 is set as a number ten order of the first output data, B-R data of B-G-R-G data of the sixth output amplifier Y6 is set as a number eleven order of the first output data, G-G data of the B-G-R-G data of the sixth output amplifier Y6 is set as a number twelve order of the first output data, B-R data of B-G-R-G data of the seventh output amplifier Y7 is set as a number thirteen order of the first output data, G-G data of the B-G-R-G data of the seventh output amplifier Y7 is set as a number fourteen order of the first output data, R-B data of R-G-B-G data of the eighth output amplifier Y8 is set as a number fifteen order of the first output data, and G-G data of the R-G-B-G data of the eighth output amplifier Y8 is set as a number sixteen order of the first output data. In the first order Order1 (OD1), the number one to sixteen orders may be R-B data, G-G data, B-R data, G-G data, B-R data, G-G data, R-B data, G-G data, R-B data, G-G data, B-R data, G-G data, B-R data, G-G data, R-B data, and G-G data, respectively.

As shown in FIG. 14, the data lines corresponding to the R-G-B-G data of the first output amplifier Y1 may be 541 and 542 data lines. Among the data of the first output amplifier Y1, colors of the data demuxed by CLA signal are R-B (R at a first scan timing and B at a second scan timing), and these data may be applied to the 541 data line. Among the data of the first output amplifier Y1, colors of the data demuxed by CLB signal are G-G, and these data may be applied to the 542 data line.

The data lines corresponding to the B-G-R-G data of the second output amplifier Y2 may be 539 and 540 data lines. Among the data of the second output amplifier Y2, colors of the data demuxed by CLA signal are B-R (B at a first scan timing and R at a second scan timing), and these data may be applied to the 539 data line. Among the data of the second output amplifier Y2, colors of the data demuxed by CLB signal are G-G, and these data may be applied to the 540 data line.

The data lines corresponding to the B-G-R-G data of the third output amplifier Y3 may be 543 and 544 data lines. Among the data of the third output amplifier Y3, colors of the data demuxed by CLA signal are B-R (B at a first scan timing and R at a second scan timing), and these data may be applied to the 543 data line. Among the data of the third output amplifier Y3, colors of the data demuxed by CLB signal are G-G, and these data may be applied to the 544 data line.

The data lines corresponding to the R-G-B-G data of the fourth output amplifier Y4 may be 537 and 538 data lines. Among the data of the fourth output amplifier Y4, colors of the data demuxed by CLA signal are R-B (R at a first scan timing and B at a second scan timing), and these data may be applied to the 537 data line. Among the data of the fourth output amplifier Y4, colors of the data demuxed by CLB signal are G-G, and these data may be applied to the 538 data line.

The data lines corresponding to the R-G-B-G data of the fifth output amplifier Y5 may be 545 and 546 data lines. Among the data of the fifth output amplifier Y5, colors of the data demuxed by CLA signal are R-B (R at a first scan timing and B at a second scan timing), and these data may be applied to the 545 data line. Among the data of the fifth output amplifier Y5, colors of the data demuxed by CLB signal are G-G, and these data may be applied to the 546 data line.

The data lines corresponding to the B-G-R-G data of the sixth output amplifier Y6 may be 535 and 536 data lines. Among the data of the sixth output amplifier Y6, colors of the data demuxed by CLA signal are B-R (B at a first scan timing and R at a second scan timing), and these data may be applied to the 535 data line. Among the data of the sixth output amplifier Y6, colors of the data demuxed by CLB signal are G-G, and these data may be applied to the 536 data line.

The data lines corresponding to the B-G-R-G data of the seventh output amplifier Y7 may be 547 and 548 data lines. Among the data of the seventh output amplifier Y7, colors of the data demuxed by CLA signal are B-R (B at a first scan timing and R at a second scan timing), and these data may be applied to the 547 data line. Among the data of the seventh output amplifier Y7, colors of the data demuxed by CLB signal are G-G, and these data may be applied to the 548 data line.

The data lines corresponding to the R-G-B-G data of the eighth output amplifier Y8 may be 533 and 534 data lines. Among the data of the eighth output amplifier Y8, colors of the data demuxed by CLA signal are R-B (R at a first scan timing and B at a second scan timing), and these data may be applied to the 533 data line. Among the data of the eighth output amplifier Y8, colors of the data demuxed by CLB signal are G-G, and these data may be applied to the 534 data line.

1, 2, 3, 4, 5, 6, 7, 8, 9, 10, 11, 12, 13, 14, 15 and 16 which is the first order Order1 (OD1) of first output data generated by alternately demuxing the first to eighth output amplifiers Y1, Y2, Y3, Y4, Y5, Y6, Y7 and Y8 may be data applied to the data lines 541, 542, 539, 540, 543, 544, 537, 538, 545, 546, 535, 536, 547, 548, 533 and 534 of the display region AA of the display panel 100. This corresponding relationship remains the same in the embodiment regardless of the wiring mixing.

Some of the output data of the data driver 500 may be normal data directly applied to the data lines of the display panel 100. Some of the output data of the data driver 500 may be border reduction data applied to the data lines of the display panel 100 through border reduction horizontal lines. In the present embodiment, the data corresponding to 1 to 540 data lines may be the border reduction data. The data corresponding to 541 or greater data lines may be the normal data.

When the first order Order1 (OD1) of the first output data generated by alternately demuxing the first to eighth output amplifiers Y1, Y2, Y3, Y4, Y5, Y6, Y7 and Y8 is 1, 2, 3, 4, 5, 6, 7, 8, 9, 10, 11, 12, 13, 14, 15, and 16 the first output data (corresponding to the 541, 542, 543, 544, 545, 546, 547 and 548 data lines) having the number one order, the number two order, the number five order, the number six order, the number 9 order, the number 10 order, the number 13 order, and the number 14 order may be the normal data and the first output data (corresponding to the 539, 540, 537, 538, 535, 536, 533 and 534 data lines) having the number three order, the number four order, the number seven order, the number eight order, the number 11 order, the number 12 order, the number 15 order and the number 16 order may be the border reduction data.

Referring to the demux circuit of FIG. 18 and the table of FIG. 15, first, fourth, fifth, eighth, ninth, twelfth, thirteenth and sixteenth output lines of the demux circuit may be activated by the first switching signal CLA. Second, third, sixth, seventh, tenth, eleventh, fourteenth and fifteenth output lines of the demux circuit may be activated by the second switching signal CLB.

In this structure, the data corresponding to CLA and the data corresponding to CLB may be continuously disposed by two as shown in "Switch" column of FIG. 15. Herein, 1, 2, 3, 4, 5, 6, 7, 8, 9, 10, 11, 12, 13, 14, 15 and 16 which is the first order Order1 (OD1) of the first output data may be changed to 1, 2, 4, 3, 5, 6, 8, 7, 9, 10, 12, 11, 13, 14, 16 and 15 which is a second order Order2 (OD2) for the demux switching.

When the first order Order1 (OD1) of first output data generated by alternately demuxing the first to eighth output amplifiers Y1, Y2, Y3, Y4, Y5, Y6, Y7 and Y8 is 1, 2, 3, 4, 5, 6, 7, 8, 9, 10, 11, 12, 13, 14, 15 and 16, the second order Order2 (OD2) of second output data of the demux circuit may be 1, 2, 4, 3, 5, 6, 8, 7, 9, 10, 12, 11, 13, 14, 16 and 15.

As shown in FIG. 18, in the second order Order2 (OD2), a number one order to a number eight order may be R-B data, G-G data, G-G data, B-R data, B-R data, G-G data, G-G data and R-B data and a number nine order to a number sixteen order may be R-B data, G-G data, G-G data, B-R data, B-R data, G-G data, G-G data and R-B data.

In FIG. 18, the second order Order2 (OD2) of 1, 2, 4, 3, 5, 6, 8, 7, 9, 10, 12, 11, 13, 14, 16 and 15 may be an order of prior data of the first wiring mixing structure Mix1.

Input terminals of the first wiring mixing structure Mix1 may include first to sixteenth A pads PDA and output terminals of the first wiring mixing structure Mix1 may include first to sixteenth B pads PDB.

Herein, the first A pad may be connected to the first B pad. The second A pad may be connected to the fifth B pad. The third A pad may be connected to the sixth B pad. The fourth A pad may be connected to the second B pad. The fifth A pad may be connected to the third B pad.

The sixth A pad may be connected to the seventh B pad. The seventh A pad may be connected to the eighth B pad. The eighth A pad may be connected to the fourth B pad. The ninth A pad may be connected to the thirteenth B pad. The tenth A pad may be connected to the ninth B pad. The eleventh A pad may be connected to the tenth B pad. The twelfth A pad may be connected to the fourteenth B pad. The thirteenth A pad may be connected to the fifteenth B pad. The fourteenth A pad may be connected to the eleventh B pad. The fifteenth A pad may be connected to the twelfth B pad. The sixteenth A pad may be connected to the sixteenth B pad.

When the second order Order2 (OD2) which is the order of the prior data of the first wiring mixing structure Mix1 is 1, 2, 4, 3, 5, 6, 8, 7, 9, 10, 12, 11, 13, 14, 16 and 15, a third order Order3 (OD3) which is an order of after data of the first wiring mixing structure Mix1 may be 1, 3, 5, 7, 2, 4, 6, 8, 10, 12, 14, 16, 9, 11, 13 and 15 by the first wiring mixing structure Mix1.

In FIG. 15, the data corresponding to CLA and the data corresponding to CLB may be continuously disposed by two. In FIG. 16, the data corresponding to CLA and the data corresponding to CLB may be continuously disposed by eight by the first wiring mixing structure Mix1. The eight-bundle structure may be implemented by the first wiring mixing structure Mix1.

Input terminals of the second wiring mixing structure Mix2 may include the first to sixteenth B pads PDB and output terminals of the second wiring mixing structure Mix2 may include first to sixteenth C pads PDC.

Herein, the first B pad may be connected to the first C pad. The second B pad may be connected to the fourth C pad. The third B pad may be connected to the fifth C pad. The fourth B pad may be connected to the eighth C pad. The fifth B pad may be connected to the third C pad.

The sixth B pad may be connected to the second C pad. The seventh B pad may be connected to the seventh C pad. The eighth B pad may be connected to the sixth C pad. The ninth B pad may be connected to the eleventh C pad. The tenth B pad may be connected to the tenth C pad. The eleventh B pad may be connected to the fifteenth C pad. The twelfth B pad may be connected to the fourteenth C pad. The thirteenth B pad may be connected to the ninth C pad. The fourteenth B pad may be connected to the twelfth C pad. The fifteenth B pad may be connected to the thirteenth C pad. The sixteenth B pad may be connected to the sixteenth C pad.

When the third order Order3 (OD3) which is the order of prior data of the second wiring mixing structure Mix2 is 1, 3, 5, 7, 2, 4, 6, 8, 10, 12, 14, 16, 9, 11, 13 and 15, the final order ODF which is an order of after data of the second wiring mixing structure Mix2 may be 1, 4, 2, 3, 5, 8, 6, 7, 9, 12, 10, 11, 13, 16, 14 and 15 by the second wiring mixing structure Mix2.

The data mapping errors in the eight-bundle structure may be prevented by the second wiring mixing structure Mix2.

As shown in FIG. 18, the data corresponding to the 541, 542, 543, 544, 545, 546, 547 and 548 data lines are the normal data directly outputted to the data lines DL. In contrast, the data corresponding to the 533, 534, 535, 536, 537, 538, 539 and 540 data lines DL are the border reduction data outputted to the data lines DL through a first border reduction line BRSA, a first contact hole, a second border reduction line BRSB and a second contact hole.

According to the present embodiment, the display apparatus may support the eight-bundle demux switching structure and include the wire mixing structures Mix1 and Mix2 for preventing the data mapping error so that the demux coupling may be enhanced and the data mapping error may be prevented.

In addition, the display apparatus may support the four-bundle demux switching structure and the eight-bundle demux switching structure without changing the integrated circuit ICA of the data driver 500 and the display region AA of the display panel 100.

In addition, the data driver 500 may be formed in the border reduction structure in which the data voltage applied to the data line at the center of the display panel 100 and the data voltage applied to the data line at the edge of the display panel 100 are alternatively outputted so that the dead space of the display apparatus may be reduced.

In addition, the demux circuit DXA is disposed adjacent to the integrated circuit area ICA on the second side of the bending line BL so that the dead space of the display apparatus may be further reduced.

Figure 19:
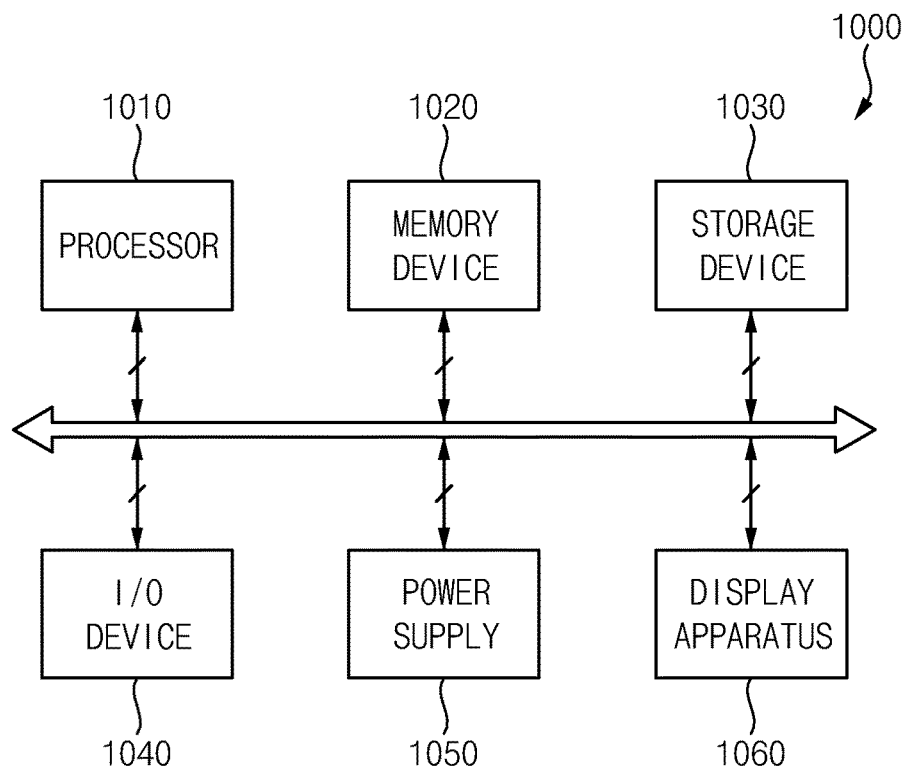
FIG. 19 is a block diagram illustrating an electronic apparatus according to an embodiment of the present inventive concept.
Figure 20:
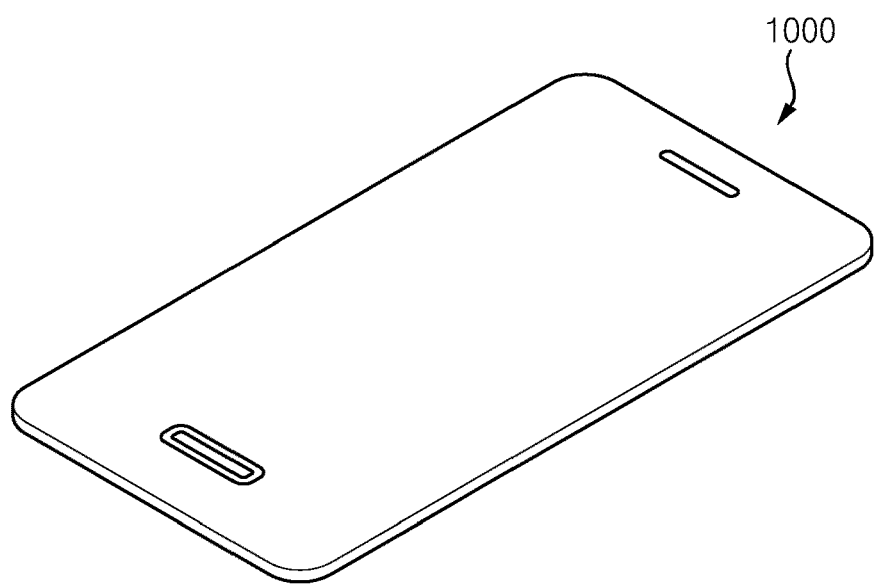
FIG. 20 is a diagram illustrating an example in which the electronic apparatus of FIG. 19 is implemented as a smart phone.

FIG. 19 is a block diagram illustrating an electronic apparatus according to an embodiment of the present inventive concept. FIG. 20 is a diagram illustrating an example in which the electronic apparatus of FIG. 19 is implemented as a smart phone.

Referring to FIGS. 19 and 20, the electronic apparatus 1000 may include a processor 1010, a memory device 1020, a storage device 1030, an input/output (I/O) device 1040, a power supply 1050, and a display apparatus 1060. Here, the display apparatus 1060 may be the display apparatus of FIG. 1. In addition, the electronic apparatus 1000 may further include a plurality of ports for communicating with a video card, a sound card, a memory card, a universal serial bus (USB) device, other electronic apparatuses, etc.

In an embodiment, as illustrated in FIG. 20, the electronic apparatus 1000 may be implemented as a smart phone. However, the electronic apparatus 1000 is not limited thereto. For example, the electronic apparatus 1000 may be implemented as a cellular phone, a video phone, a smart pad, a smart watch, a tablet PC, a car navigation system, a computer monitor, a laptop, a head mounted display (TIMID) device, and the like.

The processor 1010 may perform various computing functions or various tasks. The processor 1010 may be a micro-processor, a central processing unit (CPU), an application processor (AP), and the like. The processor 1010 may be coupled to other components via an address bus, a control bus, a data bus, etc. Further, the processor 1010 may be coupled to an extended bus such as a peripheral component interconnection (PCI) bus.

The processor 1010 may output the input image data IMG and the input control signal CONT to the driving controller 200 of FIG. 1.

The memory device 1020 may store data for operations of the electronic apparatus 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or at least one volatile memory device such as a dynamic random access memory (DRAM) device, a static random access memory (SRAM) device, a mobile DRAM device, and the like.

The storage device 1030 may include a solid state drive (SSD) device, a hard disk drive (HDD) device, a CD-ROM device, and the like. The I/O device 1040 may include an input device such as a keyboard, a keypad, a mouse device, a touch-pad, a touch-screen, and the like and an output device such as a printer, a speaker, and the like. In some embodiments, the display apparatus 1060 may be included in the I/O device 1040. The power supply 1050 may provide power for operations of the electronic apparatus 1000. The display apparatus 1060 may be coupled to other components via the buses or other communication links.

Figure 21:
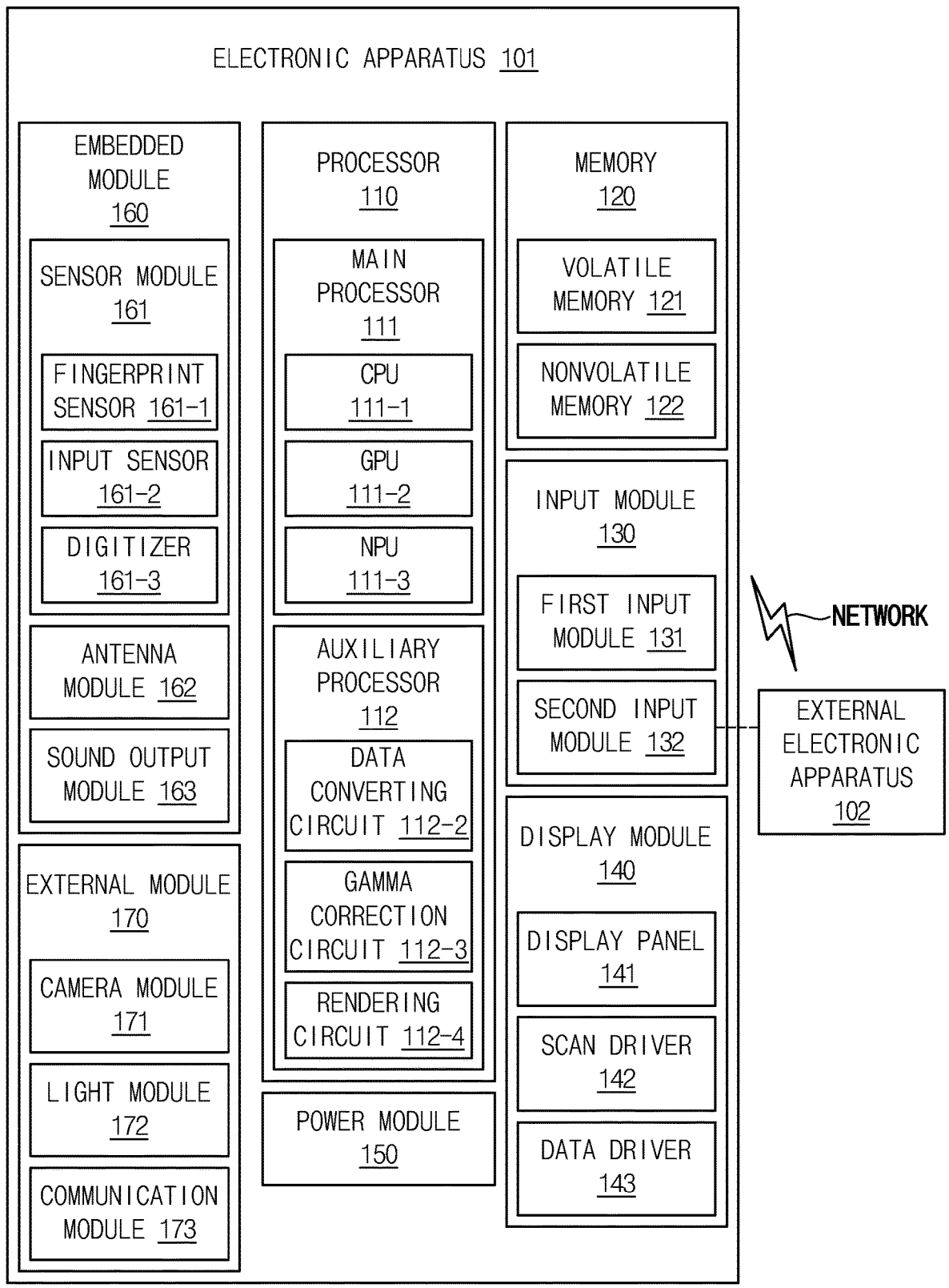
FIG. 21 is a block diagram illustrating an electronic apparatus according to an embodiment of the present inventive concept.

FIG. 21 is a block diagram illustrating an electronic apparatus 101 according to an embodiment of the present inventive concept.

Referring to FIGS. 1 to 21, an electronic apparatus 101 outputs various information through a display module 140 in an operating system. When a processor 110 executes an application stored in a memory 120, the display module 140 provides application information to a user through a display panel 141.

The processor 110 obtains an external input through an input module 130 or a sensor module 161 and executes an application corresponding to the external input. For example, when the user selects a camera icon displayed on the display panel 141, the processor 110 obtains a user input through an input sensor 161-2 and activates a camera module 171. The processor 110 transfers image data corresponding to a captured image obtained through the camera module 171 to the display module 140. The display module 140 may display an image corresponding to the captured image through the display panel 141.

In an embodiment, when a personal information authentication is executed in the display module 140, a fingerprint sensor 161-1 obtains input fingerprint information as input data.

The processor 110 compares input data obtained through the fingerprint sensor 161-1 with authentication data stored in the memory 120, and executes an application according to a comparison result. The display module 140 may display information executed according to application logic through the display panel 141.

In an embodiment, when a music streaming icon displayed on the display module 140 is selected, the processor 110 obtains a user input through the input sensor 161-2 and activates a music streaming application stored in the memory 120. When a music execution command is input in the music streaming application, the processor 110 activates a sound output module 163 to provide sound information corresponding to the music execution command to the user.

In the above, the operation of the electronic apparatus 101 is briefly described.

Hereinafter, a configuration of the electronic apparatus 101 is described in detail. Some of elements of the electronic apparatus 101 described later may be integrated and provided as one element, or one element may be separated as two or more elements.

The electronic apparatus 101 may communicate with an external electronic apparatus 102 through a network (e.g. a short-range wireless communication network or a long-range wireless communication network). According to an embodiment, the electronic apparatus 101 may include the processor 110, the memory 120, the input module 130, the display module 140, a power module 150, an embedded module 160, and an external module 170. According to an embodiment, in the electronic apparatus 101, at least one of the above-described elements may be omitted or one or more other apparatus may be added. According to an embodiment, some of the above-described elements (e.g., the sensor module 161, an antenna module 162 or the sound output module 163) may be integrated into another element (e.g. the display module 140).

The processor 110 may execute software to control at least one other element (e.g. hardware or software element) of the electronic apparatus 101 connected to the processor 110 and to perform various data processing or operations. According to an embodiment, as at least part of the data processing or the operations, the processor 110 may store receive instructions or data from other elements (e.g. the input module 130, the sensor module 161 or a communication module 173) in a volatile memory 121, may process the instructions or data stored in the volatile memory 121 and may store result data of the processing in a nonvolatile memory 122.

The processor 110 may include a main processor 111 and an auxiliary processor 112.

The main processor 111 may include at least one of a central processing unit (CPU) 111-1 and an application processor (AP). The main processor 111 may further include any one or more of a graphic processing unit (GPU) 111-2, a communication processor (CP) and an image signal processor (ISP). The main processor 111 may further include a neural network processing unit (NPU) 111-3. The neural network processing unit 111-3 is a processor specialized in processing an artificial intelligence model. The artificial intelligence model may be generated through a machine learning. The artificial intelligence model may include a plurality of artificial neural network layers. The artificial neural network may be one of a deep neural network (DNN), a convolutional neural network (CNN), a recurrent neural network (RNN), a restricted boltzmann machine (RBM), a deep belief network (DBN), a bidirectional recurrent deep neural network (BRDNN) and a deep Q-networks or a combination of two or more of the above. However, the artificial neural network is not limited to the above examples. The artificial intelligence model may include software structures, in addition to hardware structures or instead of the hardware structures. At least two of the above-described processing units and the above-described processors may be implemented as an integrated element (e.g. a single chip) or each may be implemented as independent elements (e.g. in a plurality of chips).

The auxiliary processor 112 may include a controller. The controller may include an interface conversion circuit and a timing control circuit. The controller receives an image signal from the main processor 111, converts a data format of the image signal to meet interface specifications with the display module 140, and outputs image data. The controller may output various control signals for driving the display module 140.

The auxiliary processor 112 may further include a data converting circuit 112-2, a gamma correction circuit 112-3 and a rendering circuit 112-4. The data converting circuit 112-2 may receive the image data from the controller and may compensate the image data such that the image is displayed with a desired luminance according to characteristics of the electronic apparatus 101 or a user setting or may convert the image data to reduce a power consumption or compensate for afterimages. The gamma correction circuit 112-3 may convert the image data or a gamma reference voltage such that the image displayed on the electronic apparatus 101 has desired gamma characteristics. The rendering circuit 112-4 may receive the image data from the controller and may render the image data based on a pixel arrangement of the display panel 141 included in the electronic apparatus 101. At least one of the data converting circuit 112-2, the gamma correction circuit 112-3 and the rendering circuit 112-4 may be integrated into another element (e.g. the main processor 111 or the controller). At least one of the data converting circuit 112-2, the gamma correction circuit 112-3 and the rendering circuit 112-4 may be integrated into a data driver 143 to be described later.

The memory 120 may store various data used by at least one element (e.g. the processor 110 or the sensor module 161) of the electronic apparatus 101 and input data or output data for commands related thereto. The memory 120 may include at least one of the volatile memory 121 and the nonvolatile memory 122.

The input module 130 may receive commands or data used to the elements (e.g. the processor 110, the sensor module 161 or the sound output module 163) of the electronic apparatus 101 from the outside of the electronic apparatus 101 (e.g. the user or the external electronic apparatus 102).

The input module 130 may include a first input module 131 for receiving commands or data from the user and a second input module 132 for receiving commands or data from the external electronic apparatus 102. The first input module 131 may include a microphone, a mouse, a keyboard, a key (e.g. a button) or a pen (e.g. a passive pen or an active pen). The second input module 132 may support a designated protocol capable of connecting to the external electronic apparatus 102 by wire or wirelessly. According to an embodiment, the second input module 132 may include a high definition multimedia interface (HDMI), a universal serial bus (USB) interface, an SD card interface or an audio interface. The second input module 132 may include a connector physically connected to the external electronic apparatus 102, for example, an HDMI connector, a USB connector, an SD card connector, or an audio connector (e.g. a headphone connector).

The display module 140 visually provides information to the user. The display module 140 may include the display panel 141, a scan driver 142 and the data driver 143. The display module 140 may further include a window, a chassis and a bracket to protect the display panel 141.

The display panel 141 may include a liquid crystal display panel, an organic light emitting display panel or an inorganic light emitting display panel. A type of the display panel 141 is not particularly limited. The display panel 141 may be a rigid type or a flexible type capable of being rolled or folded. The display module 140 may further include a supporter or a heat dissipation member supporting the display panel 141.

The scan driver 142 may be mounted on the display panel 141 as a driving chip.

Alternatively, the scan driver 142 may be integrated on the display panel 141. For example, the scan driver 142 may include an amorphous silicon TFT gate driver circuit (ASG) integrated on the display panel 141, a low temperature polycrystalline silicon (LTPS) TFT gate driver circuit integrated on the display panel 141, or an oxide semiconductor TFT gate driver circuit (OSG) integrated on the display panel 141. The scan driver 142 receives a control signal from the controller and outputs the scan signals to the display panel 141 in response to the control signal.

The display module 140 may further include a light emission driver. The light emission driver outputs a light emission control signal to the display panel 141 in response to a control signal received from the controller. The light emission driver may be formed independently from the scan driver 142. Alternatively, the light emission driver and the scan driver 142 may be integrally formed.

The data driver 143 receives a control signal from the controller and converts the image data into an analog voltage (e.g. the data voltage) and output the data voltages to the display panel 141 in response to the control signal.

The data driver 143 may be integrated into another element (e.g. the controller). The functions of the interface conversion circuit and the timing control circuit of the controller described above may be integrated into the data driver 143.

The display module 140 may further include a voltage generating circuit. The voltage generating circuit may output various voltages for driving the display panel 141.

The power module 150 supplies power to elements of the electronic apparatus 101. The power module 150 may include a battery which supplies a power voltage. The battery may include a non-rechargeable primary cell, a rechargeable secondary cell or a fuel cell. The power module 150 may include a power management integrated circuit (PMIC). The PMIC supplies optimized power to each of the above-described modules and modules described later. The power module 150 may include a wireless power transmission/reception member electrically connected to the battery. The wireless power transmission/reception member may include a plurality of antenna radiators in a form of coils.

The electronic apparatus 101 may further include the embedded module 160 and the external module 170. The embedded module 160 may include the sensor module 161, the antenna module 162 and the sound output module 163. The external module 170 may include the camera module 171, a light module 172 and the communication module 173.

The sensor module 161 may detect an input by a user's body or an input by the pen among the first input module 131, and generate an electrical signal or data value corresponding to the input. The sensor module 161 may include at least one of the fingerprint sensor 161-1, the input sensor 161-2 and a digitizer 161-3.

The fingerprint sensor 161-1 may generate a data value corresponding to a user's fingerprint. The fingerprint sensor 161-1 may include one of an optical fingerprint sensor or a capacitive fingerprint sensor.

The input sensor 161-2 may generate data values corresponding to coordinate information of the input by the user's body or the input by the pen. The input sensor 161-2 generates a capacitance change due to an input as a data value. The input sensor 161-2 may detect an input by the passive pen or transmit/receive data to/from the active pen.

The input sensor 161-2 may measure biosignals such as a blood pressure, a moisture, or a body fat. For example, when a user touches a part of his body to a sensor layer or a sensing panel and does not move for a certain period of time, the input sensor 161-2 may detect the biosignal based on a change in an electric field caused by the part of the body so that the display module 140 may output user's desired information.

The digitizer 161-3 may generate a data value corresponding to the coordinate information input by the pen. The digitizer 161-3 generates an amount of electromagnetic change by the input as a data value. The digitizer 161-3 may detect an input by the passive pen or transmit/receive data to/from the active pen.

At least one of the fingerprint sensor 161-1, the input sensor 161-2 and the digitizer 161-3 may be formed as a sensor layer on the display panel 141 through a continuous process. The fingerprint sensor 161-1, the input sensor 161-2 and the digitizer 161-3 may be disposed on the display panel 141. At least one of the fingerprint sensor 161-1, the input sensor 161-2 and the digitizer 161-3, for example, the digitizer 161-3, may be disposed under the display panel 141.

At least two or more of the fingerprint sensor 161-1, the input sensor 161-2 and the digitizer 161-3 may be integrated into the sensing panel through the same process. When at least two or more of the fingerprint sensor 161-1, the input sensor 161-2 and the digitizer 161-3 are integrated into the sensing panel, the sensing panel may be disposed between the display panel 141 and a window disposed over an upper surface of the display panel 141. According to an embodiment, the sensing panel may be disposed on the window. The present inventive concept may not be limited to a position of the sensing panel.

At least one of the fingerprint sensor 161-1, the input sensor 161-2 and the digitizer 161-3 may be embedded in the display panel 141. For example, at least one of the fingerprint sensor 161-1, the input sensor 161-2 and the digitizer 161-3 is formed simultaneously with the display panel 141 through a process of forming elements included in the display panel 141 (e.g. light emitting elements, transistors, etc.).

In addition, the sensor module 161 may generate an electrical signal or a data value corresponding to an internal state or an external state of the electronic apparatus 101. For example, the sensor module 161 may further include a gesture sensor, a gyro sensor, a barometric pressure sensor, a magnetic sensor, an acceleration sensor, a grip sensor, a proximity sensor, a color sensor, an IR (infrared) sensor, a biosensor, a temperature sensor, a humidity sensor or an illuminance sensor.

The antenna module 162 may include one or more antennas for transmitting a signal or power to outside or receiving a signal or power from outside. According to an embodiment, the communication module 173 may transmit a signal to an external electronic apparatus or receive a signal from an external electronic apparatus through an antenna suitable for a communication method. An antenna pattern of the antenna module 162 may be integrated with an element of the display module 140 (e.g. the display panel 141) or the input sensor 161-2.

The sound output module 163 is a device for outputting sound signals to the outside of the electronic apparatus 101. For example, the sound output module 163 may include a speaker used for general purposes such as playing multimedia or recording and a receiver used exclusively for receiving a call. According to an embodiment, the receiver may be formed integrally with or separately from the speaker. A sound output pattern of the sound output module 163 may be integrated with the display module 140.

The camera module 171 may capture still images and moving images. According to an embodiment, the camera module 171 may include one or more lenses, an image sensor or an image signal processor. The camera module 171 may further include an infrared camera capable of determining a presence or an absence of a user, the user's location and the user's gaze.

The light module 172 may provide a light. The light module 172 may include a light emitting diode or a xenon lamp. The light module 172 may operate in conjunction with the camera module 171 or operate independently.

The communication module 173 may support establishment of a wired or wireless communication channel between the electronic apparatus 101 and the external electronic apparatus 102 and communication through the established communication channel. The communication module 173 may include one or both of a wireless communication module such as a cellular communication module, a short-distance wireless communication module, or a global navigation satellite system (GNSS) communication module and a wired communication module such as a local area network (LAN) communication module, or a power line communication module. The communication module 173 may communicate with the external electronic apparatus 102 through a short-range communication network such as Bluetooth, WiFi direct or infrared data association (IrDA) or a long-distance communication network such as a cellular network, the Internet, or a computer network (e.g. LAN or WAN). The various types of communication modules 173 described above may be implemented as a single chip or may be implemented as separate chips.

The input module 130, the sensor module 161 and the camera module 171 may be used to control the operation of the display module 140 in conjunction with the processor 110.

The processor 110 outputs commands or data to the display module 140, the sound output module 163, the camera module 171 or the light module 172 based on the input data received from the input module 130. For example, the processor 110 may generate image data corresponding to input data applied through a mouse or an active pen, and output the generated image data to the display module 140 or the processor 110 may generate command data corresponding to the input data and output the generated command data to the camera module 171 or the light module 172. When input data is not received from the input module 130 for a certain period of time, the processor 110 converts an operation mode of the electronic apparatus 101 into a low power mode or a sleep mode so that a power consumption of the electronic apparatus 101 may be reduced.

The processor 110 outputs commands or data to the display module 140, the sound output module 163, the camera module 171 or the light module 172 based on sensed data received from the sensor module 161. For example, the processor 110 may compare authentication data applied by the fingerprint sensor 161-1 with authentication data stored in the memory 120, and then execute an application according to the comparison result. The processor 110 may execute commands or output corresponding image data to the display module 140 based on the sensed data sensed by the input sensor 161-2 or the digitizer 161-3. When the sensor module 161 includes a temperature sensor, the processor 110 may receive temperature data for the temperature measured from the sensor module 161 and may further perform luminance correction on the image data based on the temperature data.

The processor 110 may receive determined data about the presence or the absence of the user, the user's location and the user's gaze from the camera module 171. The processor 110 may further perform luminance correction on the image data based on the determined data. For example, the processor 110, which determines the presence or the absence of the user through an input from the camera module 171, may display image data having the luminance corrected by the data converting circuit 112-2 or the gamma correction circuit 112-3 to the display module 140.

Some of the above elements may be connected to each other through a communication method between peripheral devices such as a bus, a general purpose input/output (GPIO), a serial peripheral interface (SPI), a mobile industry processor interface (MIPI), or a ultra path interconnect (UPI) link to exchange signals (e.g. commands or data) with each other. The processor 110 may communicate with the display module 140 through an agreed interface. For example, the processor 110 may communicate with the display module 140 through any one of the above communication methods. The present invention may not be limited to the above communication methods.

The electronic apparatus 101 according to various embodiments disclosed in the disclosure may be various types of apparatuses. For example, the electronic apparatus 101 may include at least one of a portable communication apparatus (e.g. a smart phone), a computer apparatus, a portable multimedia apparatus, a portable medical apparatus, a camera, a wearable device and a home appliance. The electronic apparatus 101 according to the embodiment of the disclosure may not be limited to the aforementioned apparatuses.

For example, the display panel 100 of FIG. 1 may correspond to the display panel 141 of FIG. 21. For example, the driving controller 200 of FIG. 1 may correspond to the controller of the auxiliary processor 112 of FIG. 21. For example, the gate driver 300 of FIG. 1 may correspond to the scan driver 142 of FIG. 21. For example, the data driver 500 of FIG. 1 may correspond to the data driver 143 of FIG. 21.

According to the display apparatus in the present inventive concept, the demux coupling may be enhanced and the data mapping error may be prevented.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept.

Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A display apparatus comprising:
    a data driver including first to fourth output amplifiers;
    a demux circuit configured to branch the first to fourth output amplifiers to first to eighth output lines through demux switching;
    a first wiring mixing structure connected to the demux circuit;
    a second wiring mixing structure connected to the first wiring mixing structure;
    a display panel including data lines connected to the second wiring mixing structure; and
    a bending area disposed between the display panel and the data driver,
    wherein the demux circuit is disposed between an integrated circuit area of the data driver and the bending area,
    wherein the bending area includes a bending line for folding elements toward a rear surface of the display panel,
    wherein the display panel is disposed on a first side of the bending line and the demux circuit and the integrated circuit area are disposed on a second side of the bending line, and
    wherein the first wiring mixing structure and the second wiring mixing structure are serially connected between the demux circuit and the display panel.

2. The display apparatus of claim 1, wherein, when a first order of first output data generated by alternately demuxing the first to fourth output amplifiers is 1, 2, 3, 4, 5, 6, 7 and 8, a final order of final output data outputted by the second wiring mixing structure is 1, 4, 2, 3, 5, 8, 6 and 7.

3. The display apparatus of claim 2, wherein some of output data of the data driver are normal data directly applied to data lines of the display panel, and
    wherein some of the output data of the data driver are border reduction data applied to data lines of the display panel through border reduction horizontal lines.

4. The display apparatus of claim 3, wherein, when the first order of the first output data generated by alternately demuxing the first to fourth output amplifiers is 1, 2, 3, 4, 5, 6, 7 and 8, the first output data having a number one order, a number two order, a number five order and a number six order are the normal data and the first output data having a number three order, a number four order, a number seven order and a number eight order are the border reduction data.

5. The display apparatus of claim 2, wherein the first, the fourth, the fifth and the eighth output lines of the demux circuit are activated by a first switching signal, and
    wherein the second, the third, the sixth and the seventh output lines of the demux circuit are activated by a second switching signal.

6. The display apparatus of claim 5, wherein, when the first order of the first output data generated by alternately demuxing the first to fourth output amplifiers is 1, 2, 3, 4, 5, 6, 7 and 8, a second order of second output data of the demux circuit is 1, 2, 4, 3, 5, 6, 8 and 7.

7. The display apparatus of claim 6, wherein, when the second order which is an order of prior data of the first wiring mixing structure is 1, 2, 4, 3, 5, 6, 8 and 7, a third order which is an order of after data of the first wiring mixing structure is 1, 3, 2, 4, 6, 8, 5 and 7.

8. The display apparatus of claim 7, wherein, when the third order which is an order of prior data of the second wiring mixing structure is 1, 3, 2, 4, 6, 8, 5 and 7, the final order which is an order of after data of the second wiring mixing structure is 1, 4, 2, 3, 5, 8, 6 and 7.

9. The display apparatus of claim 1, wherein input terminals of the first wiring mixing structure include first to eighth A pads and output terminals of the first
    wiring mixing structure include first to eighth B pads,
    wherein the first A pad is connected to the first B pad,
    wherein the second A pad is connected to the third B pad,
    wherein the third A pad is connected to the fourth B pad,
    wherein the fourth A pad is connected to the second B pad,
    wherein the fifth A pad is connected to the seventh B pad,
    wherein the sixth A pad is connected to the fifth B pad,
    wherein the seventh A pad is connected to the sixth B pad, and
    wherein the eighth A pad is connected to the eighth B pad.

10. The display apparatus of claim 1, wherein input terminals of the second wiring mixing structure include first to eighth B pads and output terminals of the second wiring mixing structure include first to eighth C pads,
    wherein the first B pad is connected to the first C pad,
    wherein the second B pad is connected to the fourth C pad,
    wherein the third B pad is connected to the third C pad,
    wherein the fourth B pad is connected to the second C pad,
    wherein the fifth B pad is connected to the seventh C pad,
    wherein the sixth B pad is connected to the sixth C pad,
    wherein the seventh B pad is connected to the fifth C pad, and
    wherein the eighth B pad is connected to the eighth C pad.

11. The display apparatus of claim 1, wherein input terminals of the first wiring mixing structure include first to eighth A pads and output terminals of the first wiring mixing structure include first to eighth B pads,
    wherein input terminals of the second wiring mixing structure include the first to eighth B pads and output terminals of the second wiring mixing structure include first to eighth C pads,
    wherein the first A pad is connected to the first B pad,
    wherein the second A pad is connected to the third B pad,
    wherein the third A pad is connected to the fourth B pad,
    wherein the fourth A pad is connected to the second B pad,
    wherein the fifth A pad is connected to the seventh B pad,
    wherein the sixth A pad is connected to the fifth B pad,
    wherein the seventh A pad is connected to the sixth B pad,
    wherein the eighth A pad is connected to the eighth B pad,
    wherein the first B pad is connected to the first C pad,
    wherein the second B pad is connected to the fourth C pad,
    wherein the third B pad is connected to the third C pad,
    wherein the fourth B pad is connected to the second C pad,
    wherein the fifth B pad is connected to the seventh C pad,
    wherein the sixth B pad is connected to the sixth C pad, wherein the seventh B pad is connected to the fifth C pad, and wherein the eighth B pad is connected to the eighth C pad.

12. The display apparatus of claim 2, wherein the first, the fourth, the fifth, the eighth, a ninth, a twelfth, a thirteenth and a sixteenth output lines of the demux circuit are activated by a first switching signal, and wherein the second, the third, the sixth, the seventh, a tenth, an eleventh, a fourteenth and a fifteenth output lines of the demux circuit are activated by a second switching signal.

13. The display apparatus of claim 12, wherein the data driver further comprises fifth to eighth output amplifiers, wherein, when the first order of first output data generated by alternately demuxing the first to eighth output amplifiers is 1, 2, 3, 4, 5, 6, 7, 8, 9, 10, 11, 12, 13, 14, 15 and 16, a second order of second output data of the demux circuit is 1, 2, 4, 3, 5, 6, 8, 7, 9, 10, 12, 11, 13, 14, 16 and 15.

14. The display apparatus of claim 13, wherein, when the second order which is an order of prior data of the first wiring mixing structure is 1, 2, 4, 3, 5, 6, 8, 7, 9, 10, 12, 11, 13, 14, 16 and 15, a third order which is an order of after data of the first wiring mixing structure is 1, 3, 5, 7, 2, 4, 6, 8, 10, 12, 14, 16, 9, 11, 13 and 15.

15. The display apparatus of claim 14, wherein, when the third order which is an order of prior data of the second wiring mixing structure is 1, 3, 5, 7, 2, 4, 6, 8, 10, 12, 14, 16, 9, 11, 13 and 15, the final order which is an order of after data of the second wiring mixing structure is 1, 4, 2, 3, 5, 8, 6, 7, 9, 12, 10, 11, 13, 16, 14 and 15.

16. The display apparatus of claim 1, wherein input terminals of the first wiring mixing structure include first to sixteenth A pads and output terminals of the first wiring mixing structure include first to sixteenth B pads, wherein the first A pad is connected to the first B pad,
wherein the second A pad is connected to the fifth B pad,
wherein the third A pad is connected to the sixth B pad,
wherein the fourth A pad is connected to the second B pad,
wherein the fifth A pad is connected to the third B pad,
wherein the sixth A pad is connected to the seventh B pad,
wherein the seventh A pad is connected to the eighth B pad,
wherein the eighth A pad is connected to the fourth B pad,
wherein the ninth A pad is connected to the thirteenth B pad,
wherein the tenth A pad is connected to the ninth B pad,
wherein the eleventh A pad is connected to the tenth B pad,
wherein the twelfth A pad is connected to the fourteenth B pad,
wherein the thirteenth A pad is connected to the fifteenth B pad,
wherein the fourteenth A pad is connected to the eleventh B pad,
wherein the fifteenth A pad is connected to the twelfth B pad, and
wherein the sixteenth A pad is connected to the sixteenth B pad.

17. The display apparatus of claim 1, wherein input terminals of the second wiring mixing structure include first to sixteenth B pads and output terminals of the second wiring mixing structure include first to sixteenth C pads, wherein the first B pad is connected to the first C pad,
wherein the second B pad is connected to the fourth C pad,
wherein the third B pad is connected to the fifth C pad,
wherein the fourth B pad is connected to the eighth C pad,
wherein the fifth B pad is connected to the third C pad,
wherein the sixth B pad is connected to the second C pad,
wherein the seventh B pad is connected to the seventh C pad,
wherein the eighth B pad is connected to the sixth C pad,
wherein the ninth B pad is connected to the eleventh C pad,
wherein the tenth B pad is connected to the tenth C pad,
wherein the eleventh B pad is connected to the fifteenth C pad,
wherein the twelfth B pad is connected to the fourteenth C pad,
wherein the thirteenth B pad is connected to the ninth C pad,
wherein the fourteenth B pad is connected to the twelfth C pad,
wherein the fifteenth B pad is connected to the thirteenth C pad, and
wherein the sixteenth B pad is connected to the sixteenth C pad.

18. The display apparatus of claim 1, wherein input terminals of the first wiring mixing structure include first to sixteenth A pads and output terminals of the first wiring mixing structure include first to sixteenth B pads, wherein input terminals of the second wiring mixing structure include the first to sixteenth B pads and output terminals of the second wiring mixing structure include first to sixteenth C pads, wherein the first A pad is connected to the first B pad,
wherein the second A pad is connected to the fifth B pad,
wherein the third A pad is connected to the sixth B pad,
wherein the fourth A pad is connected to the second B pad,
wherein the fifth A pad is connected to the third B pad,
wherein the sixth A pad is connected to the seventh B pad,
wherein the seventh A pad is connected to the eighth B pad,
wherein the eighth A pad is connected to the fourth B pad,
wherein the ninth A pad is connected to the thirteenth B pad,
wherein the tenth A pad is connected to the ninth B pad,
wherein the eleventh A pad is connected to the tenth B pad,
wherein the twelfth A pad is connected to the fourteenth B pad,
wherein the thirteenth A pad is connected to the fifteenth B pad,
wherein the fourteenth A pad is connected to the eleventh B pad,
wherein the fifteenth A pad is connected to the twelfth B pad,
wherein the sixteenth A pad is connected to the sixteenth B pad,
wherein the first B pad is connected to the first C pad,
wherein the second B pad is connected to the fourth C pad,
wherein the third B pad is connected to the fifth C pad,
wherein the fourth B pad is connected to the eighth C pad,
wherein the fifth B pad is connected to the third C pad,
wherein the sixth B pad is connected to the second C pad,
wherein the seventh B pad is connected to the seventh C pad,
wherein the eighth B pad is connected to the sixth C pad,
wherein the ninth B pad is connected to the eleventh C pad,
wherein the tenth B pad is connected to the tenth C pad, wherein the eleventh B pad is connected to the fifteenth C pad, wherein the twelfth B pad is connected to the fourteenth C pad, wherein the thirteenth B pad is connected to the ninth C pad, wherein the fourteenth B pad is connected to the twelfth C pad, wherein the fifteenth B pad is connected to the thirteenth C pad, and wherein the sixteenth B pad is connected to the sixteenth C pad.

19. A display apparatus comprising:

a data driver including first to fourth output amplifiers;

a demux circuit configured to branch the first to fourth output amplifiers to first to eighth output lines through demux switching;

a first wiring mixing structure connected to the demux circuit;

a second wiring mixing structure connected to the first wiring mixing structure; and a display panel including data lines connected to the second wiring mixing structure wherein, when a first order of first output data generated by alternately demuxing the first to fourth output amplifiers is 1, 2, 3, 4, 5, 6, 7 and 8, a final order of final output data outputted by the second wiring mixing structure is 1, 4, 2, 3, 5, 8, 6 and 7, and wherein the first wiring mixing structure and the second wiring mixing structure are serially connected between the demux circuit and the display panel.

20. An electronic apparatus comprising:

a data driver including first to fourth output amplifiers;

a demux circuit configured to branch the first to fourth output amplifiers to first to eighth output lines through demux switching;

a first wiring mixing structure connected to the demux circuit;

a second wiring mixing structure connected to the first wiring mixing structure;

a display panel including data lines connected to the second wiring mixing structure;

a bending area disposed between the display panel and the data driver, wherein the demux circuit is disposed between an integrated circuit area of the data driver and the bending area, wherein the bending area includes a bending line for folding elements toward a rear surface of the display panel, and wherein the display panel is disposed on a first side of the bending line and the demux circuit and the integrated circuit area are disposed on a second side of the bending line, and wherein the first wiring mixing structure and the second wiring mixing structure are serially connected between the demux circuit and the display panel.

* * * * *